United States Patent
Choi et al.

(10) Patent No.: US 8,687,158 B2
(45) Date of Patent: Apr. 1, 2014

(54) IPS LCD HAVING A FIRST COMMON ELECTRODE DIRECTLY EXTENDING FROM THE COMMON LINE AND A SECOND COMMON ELECTRODE CONTACTS THE COMMON LINE ONLY THROUGH A CONTACT HOLE OF THE GATE INSULATING LAYER

(75) Inventors: Byung-Kook Choi, Incheon (KR); Hyo-Uk Kim, Gyeongsangbuk-do (KR); Chang-Bin Lee, Busan (KR)

(73) Assignee: LG Display Co. Ltd., Seoul (KR)

( * ) Notice: Subject to any disclaimer, the term of this patent is extended or adjusted under 35 U.S.C. 154(b) by 799 days.

(21) Appl. No.: 11/818,319

(22) Filed: Jun. 14, 2007

(65) Prior Publication Data
US 2008/0013026 A1  Jan. 17, 2008

(30) Foreign Application Priority Data
Jun. 30, 2006  (KR) .................. 10-2006-0060865

(51) Int. Cl.
*G02F 1/1345*  (2006.01)

(52) U.S. Cl.
USPC ........................................ 349/141

(58) Field of Classification Search
USPC ................................ 349/114, 141
See application file for complete search history.

(56) References Cited

U.S. PATENT DOCUMENTS

| | | | | |
|---|---|---|---|---|
| 5,907,379 | A * | 5/1999 | Kim et al. | 349/141 |
| 6,177,970 | B1 * | 1/2001 | Kim | 349/43 |
| 2001/0005252 | A1 * | 6/2001 | Lee et al. | 349/141 |
| 2001/0040646 | A1 * | 11/2001 | Hannuki et al. | 349/43 |
| 2001/0040662 | A1 * | 11/2001 | Cheng et al. | 349/141 |
| 2007/0153198 | A1 * | 7/2007 | Cho et al. | 349/141 |

FOREIGN PATENT DOCUMENTS

| | | |
|---|---|---|
| DE | 10 2004 015 276 A1 | 11/2004 |
| JP | 11-024095 | 1/1999 |
| JP | 2001-222030 | 8/2001 |
| JP | 2001-311965 | 11/2001 |

OTHER PUBLICATIONS

Office Action issued in corresponding German Patent Application No. 10 2007 027 645.3-51; issued Jul. 30, 2008.
Office Action issued in corresponding Japanese Patent Application No. 2007-164291; issued Sep. 28, 2010.

* cited by examiner

*Primary Examiner* — Lauren Nguyen
(74) *Attorney, Agent, or Firm* — Brinks Gilson & Lione

(57) ABSTRACT

An array substrate for an in-plane switching mode liquid crystal display device includes: a gate line on a substrate; a data line crossing the gate line to define a pixel region on the substrate; a common line parallel to and spaced apart from the gate line; a gate electrode connected to the gate line; a semiconductor layer disposed over the gate electrode, wherein an area of the semiconductor layer is less than an area of the gate electrode; a source electrode connected to the data line, and a drain electrode spaced apart from the source electrode, the source and drain electrodes disposed on the semiconductor layer; a plurality of pixel electrodes integrated with the drain electrode and extending from the drain electrode in the pixel region; and a plurality of common electrodes connected to the common line and alternately arranged with the plurality of pixel electrodes, wherein each of the source electrode, the drain electrode, the data line and the plurality of pixel electrodes are comprised from a first conductive material layer and a second conductive material layer, wherein the second conductive material layer is disposed on the first conductive material layer.

13 Claims, 37 Drawing Sheets

IPS LCD HAVING A FIRST COMMON ELECTRODE DIRECTLY EXTENDING FROM THE COMMON LINE AND A SECOND COMMON ELECTRODE CONTACTS THE COMMON LINE ONLY THROUGH A CONTACT HOLE OF THE GATE INSULATING LAYER

This application claims the benefit of Korean Patent Application No. 10-2006-0060865, filed on Jun. 30, 2006, which is hereby incorporated by reference for all purposes as if fully set forth herein.

BACKGROUND

1. Field of the Disclosure

The present disclosure relate to an in-plane switching (IPS) mode liquid crystal display (LCD) device, and more particularly, to an array substrate for an IPS mode LCD device and a fabrication method for the array substrate having a higher quality image display and improved aperture ratio.

2. Discussion of the Related Art

A conventional LCD device uses an optical anisotropic property and polarization properties of liquid crystal molecules to display images. The liquid crystal molecules have orientation characteristics related to the arrangement of multiple molecules that result from their thin and long shape. The arrangement of liquid crystal molecules, and their direction may be controlled by applying an electrical field to them. Accordingly, when the electric field is applied to the liquid crystal molecules, the polarization properties of light are changed based on the arrangement of the liquid crystal molecules, which enables an LCD device to display images.

Among the common type of LCD devices, are active matrix LCD (AM-LCD) devices, which have thin film transistors (TFTs) arranged in a matrix form. Active matrix LCD devices are subject to relatively significant research and development because of their high resolution and superior ability in displaying moving images.

The LCD device includes a first substrate, a second substrate and a liquid crystal layer interposed therebetween. A common electrode and a pixel electrode are respectively formed on the first and second substrates. The first and second substrates may be referred to as a color substrate and an array substrate, respectively. The liquid crystal layer is driven by a vertical electric field induced between the common and pixel electrodes. Although, LCD devices tend to have good transmittance and aperture ratios, LCD devices using a vertical electric field have a narrow viewing angle. An IPS mode LCD device may have a wider viewing angle.

FIG. 1 is a schematic cross-sectional view of an IPS mode LCD device according to the related art. As shown in FIG. 1, the IPS mode LCD device 1 includes an array substrate AS, a color filter substrate CS and a liquid crystal layer LC. The array substrate AS and the color filter substrate CS are adjacent one another, and the liquid crystal layer LC is interposed therebetween. The array substrate AS includes a first substrate 10 including a pixel region P, a thin film transistor (TFT) T, a plurality of common electrodes 30 and a plurality of pixel electrodes 32. The TFT T, the plurality of common electrodes 30 and the plurality of pixel electrodes 32 are formed at the pixel region P. The TFT T is disposed at the pixel region P and includes a gate electrode 14, a semiconductor layer 18, a source electrode 20 and a drain electrode 22. The source and drain electrodes 20 and 22 are spaced apart from one another. The plurality of common electrodes 30 and the plurality of pixel electrodes 32 are formed on the same layer. The plurality of common electrodes 30 and the plurality of pixel electrodes 32 are parallel to and arranged to alternate with one another.

Although not shown, a gate line connected to the gate electrode 14 is formed along a first direction on the first substrate 10, and a data line is connected to the source electrode 20 along a second direction on the first substrate 10. The gate line crosses the data line to define the pixel region P. In addition, a common line, which is connected to the plurality of common electrodes 30 and parallel to the gate line, is formed along a first direction on the first substrate 10.

The color filter substrate CS includes a second substrate 40, a black matrix 42 and a color filter layer 34. The black matrix 42 shields portions except for the plurality of pixel regions P. The color filter layer 34 is formed on the black matrix 42 and corresponds to the plurality of pixel regions P. Particularly, the color filter layer 34 including a red sub-color filter 34a, a green sub-color filter 34b and a blue sub-color filter (not shown). The liquid crystal layer LC is driven by a horizontal electric field 45 induced between each common electrode 30 and each pixel electrode 32.

FIG. 2 is a schematic plan view of an array substrate for an IPS mode LCD device according to the related art. The array substrate in FIG. 2 is fabricated through a four mask process. As shown in FIG. 2, a gate line 54 along a first direction is formed on a substrate 50, and a data line 92 along a second direction is formed on the substrate 50. The gate line 54 crosses the data line 92 to define a pixel region P. A gate pad 56 is disposed at one end of the gate line 54, and a data pad 94 is disposed at one end of the data line 92. A common line 58 is formed to be parallel with and spaced apart from the gate line 54. A gate pad terminal GP contacting the gate pad 56 is disposed on the gate pad 56, and a data pad terminal DP contacting the data pad 94 is disposed on the data pad 94.

A TFT T including a gate electrode 52, an active layer 84, an ohmic contact layer (not shown), a source electrode 88 and a drain electrode 90 are disposed at a crossing of the gate and data lines 54 and 92. The gate electrode 52 is connected to the gate line 54. The active layer 84 is disposed at the gate electrode 52, and the ohmic contact layer (not shown) is disposed at the active layer 84. The source and drain electrodes 88 and 90 are disposed at the ohmic contact layer (not shown) and the source and drain electrodes 88 and 90 are spaced apart from each other. The source electrode 88 is connected to the data line 92. A plurality of pixel electrodes 99 connected to the drain electrode 90 are disposed at the pixel region P. A plurality of common electrodes 97 connected to the common line 58 are disposed at the pixel region P. The plurality of pixel electrodes 99 are alternately arranged with the plurality of common electrodes 97.

Since the source electrode 88, the drain electrode 90, the data line 92 and the active layer 84 are formed using a single mask, they have the same shape. As a result, an intrinsic amorphous silicon layer 72 which extends the active layer 84 protrudes beyond the source electrode 88, the drain electrode 90 and the data line 92. The intrinsic amorphous silicon layer 72 and the active layer 84 are exposed by light to generate a photo-current. The photo-current may cause an off current in the TFT T such that a property of the TFT T is degraded. In addition, the light leakage current may cause a coupling of signals in the data line 92 and the pixel electrode 99, which may generate deterioration of displayed images, including a wavy noise on an image. As discussed above, as a result of the source electrode 88, the drain electrode 90, the data line 92 and the active layer 84 being formed using a single mask, the off current and resulting image defect may be generated.

FIGS. 3A to 3H, FIGS. 4A to 4H, FIGS. 5A to 5H, FIGS. 6A to 6H are schematic cross-sectional views taken along lines "III-III," "IV-IV," "V-V," "VI-VI" of FIG. 2, respectively, showing a fabricating process of an array substrate for an IPS mode LCD device according the related art.

FIGS. 3A, 4A, 5A and 6A show a first mask process. As shown in FIGS. 3A, 4A, 5A and 6A, a substrate 50 includes a pixel region P including a switching region S, a gate region GA, a data region DA and a common signal region CA. A gate line (not shown), a gate pad 56 and a gate electrode 52 are formed on the substrate 50. The gate pad 56 is formed in the gate region GA and disposed at one end of the gate line. The gate electrode 52 is connected to the gate line and disposed in the switching region S. A common line, which is parallel to and spaced apart from the gate line, is formed in the common signal region CA.

FIGS. 3B to 3F, 4B to 4F, 5B to 5F and 6B to 6F show a second mask process. As shown in FIGS. 3B, 4B, 5B and 6B, a gate insulating layer 60, an intrinsic amorphous silicon (a-Si:H) layer 62, an impurity-doped amorphous silicon (n+ or p+ a-Si:H) layer 64 and a first conductive metal layer 66 are sequentially formed on the substrate 50 including the gate electrode 52, the gate line, the gate pad 56 and the common line 58. A photosensitive material layer 68 is formed on the first conductive metal layer 66 by coating a photoresist. Then, a mask M having a transmitting area TA, a shielding area SA and a half-transmitting area HTA is disposed over the photosensitive material layer 68.

The transmitting area TA has a relatively high transmittance so that light through the transmitting portion TA can change the chemical characteristics of the photosensitive material layer 68. The shielding area SA shields light completely. The half-transmitting area HTA has a slit structure or a half-transmitting film so that the intensity or transmittance of light through the half-transmitting area HTA may be lowered. As a result, a transmittance of the half-transmitting area HTA is smaller than that of the transmitting area TA and is greater than that of the shielding area SA. The half-transmitting area HTA with shielding areas SA at both sides of the half-transmitting area HTA corresponds to the switching region S as in FIG. 3B. One of the shielding areas SA shields a portion of the pixel region P. The transmitting area TA corresponds to the other portion of the pixel region P and the gate region GA. The shielding area SA corresponds to the data region DA as in FIG. 4B. The photosensitive material layer 68 is exposed to light through the mask M.

As shown in FIGS. 3C, 4C, 5C and 6C, the photosensitive material layer 68 (of FIGS. 3B, 4B, 5B and 6B) is developed to form first and second photosensitive patterns 70a and 70b in the switching region S and the data region DA, respectively. The first photosensitive pattern 70a corresponding to the gate electrode 52 has a portion of a relatively lower thickness than other portions. The first conductive metal layer 66 is exposed through the first and second photosensitive patterns 70a and 70b. The first conductive metal layer 66, the impurity-doped amorphous silicon layer 64 and the intrinsic amorphous silicon layer 62 are etched using the first and second photosensitive patterns 70a and 70b as an etching mask. For example, after the first conductive metal layer 66 is etched, the impurity-doped amorphous silicon layer 64 and the intrinsic amorphous silicon layer 62 may be etched using a dry-etching method. The etching may depend on the type of the first conductive metal layer 66.

As shown in FIGS. 3D, 4D, 5D and 6D, a first semiconductor pattern 76 including an intrinsic amorphous silicon pattern 72 and an impurity-doped amorphous silicon pattern 74 and a first metal pattern 78 are formed in the switching region S under the first photosensitive pattern 70a. A second semiconductor pattern 80 extending from the first semiconductor pattern 76 and a second metal pattern 82 extending from the first metal pattern 78 are formed in the data region DA under the second photosensitive pattern 70b. Then, the first and second photosensitive patterns 70a and 70b are partially removed.

As shown in FIGS. 3E, 4E, 5E and 6E, the first metal pattern 78 corresponding to the gate electrode 52 and both sides of the first photosensitive pattern 70a is exposed. Likewise, the second metal pattern 82 at both sides of the second photosensitive pattern 70b is also exposed. In particular, a portion of the first photosensitive pattern 70a having a relatively small thickness is completely removed to expose the first metal pattern 78. The other portion of the first photosensitive pattern 70a, and the second photosensitive pattern 70b are partially removed.

As shown in FIGS. 3F, 4F, 5F and 6F, the first metal pattern 78 (of FIG. 3E) exposed through the first photosensitive pattern 70a and the impurity-doped amorphous silicon pattern 74 (of FIG. 3E) under the exposed first metal pattern 78 are etched using the first photosensitive pattern 70a to from an active layer 84, an ohmic contact layer 86, a source electrode 88 and a drain electrode 90. The active layer 84 is disposed on the gate insulating layer 60 and corresponds to the gate electrode 52. The ohmic contact layer 86 is disposed on the active layer 84. The source and drain electrodes 88 and 90 are disposed on the ohmic contact layer 86 and spaced apart from one another. Since the first metal pattern 78 (of FIG. 3E) and the impurity-doped amorphous silicon pattern 74 (of FIG. 3E) are etched to form the source electrode 88, the drain electrode 90 and the ohmic contact layer 86, the active layer 84 is exposed through the source electrode 88, the drain electrode 90 and the ohmic contact layer 86. The exposed active layer 84 is defined as a channel. When the impurity-doped amorphous silicon pattern 74 (of FIG. 3E) is etched, the active layer 84 is over-etched so that impurities do not remain on the active layer 84.

The second metal layer 82 (of FIG. 4E) and the impurity-doped amorphous silicon pattern 74 of a second semiconductor pattern 80 may be etched simultaneously using the second photosensitive pattern 70b to form a data line 94 in the data region DA. The data line 92 crosses the gate line to define the pixel region P. A data pad 94 is formed at one end of the data line 92. The second mask process is finished by removing the first and second photosensitive patterns 70a and 70b. Further, an edge "AT" of the active layer 84 and the intrinsic amorphous silicon pattern 72 is exposed at the source and drain electrodes 88 and 90 and the data line 92.

FIGS. 3G, 4G, 5G and 6G show a third mask process. As shown in FIGS. 3G, 4G, 5G and 6G, a passivation layer 96 is formed on the source electrode 88, the drain electrode 90, the data pad 94 and the data line 92. The passivation layer 96 is patterned to form a drain contact hole 98a, a common line contact hole 98b, a gate pad contact hole 98c and a data line contact hole 98d. The drain contact hole 98a exposes the drain electrode 90, the common line contact hole 98b exposes the common line 58, the gate pad contact hole 98c exposes the gate pad 56, and the data pad contact hole 98d exposes the data pad 94.

FIGS. 3H, 4H, 5H and 6H show a fourth mask process. As shown in FIGS. 3H, 4H, 5H and 6H, a transparent conductive material layer (not shown) is formed on the passivation layer 96. The transparent conductive material layer is etched to form a plurality of pixel electrodes 99 and a plurality of common electrodes 97 in the pixel region P. The plurality of pixel electrodes 99 and the plurality of common electrodes 97 are alternately arranged with one another. The plurality of pixel electrodes 99 are connected to the drain electrode 90 through the drain contact hole 98*a* (of FIG. 3G). The plurality of common electrodes 97 are connected to the common line 56 through the common line contact hole 98*b*. A gate pad terminal GP is formed on the gate pad 56, and a data pad terminal DP is formed on the data pad 94. The gate pad terminal GP is connected to the gate pad 56 through the gate pad contact hole 98*c*. The data pad terminal DP is connected to the data pad 94 through the data pad contact hole 98*d*.

Through the above four mask process, the array substrate is fabricated. As discussed above, since the second metal layer, the impurity-doped amorphous silicon layer and the intrinsic amorphous silicon layer are patterned using a single mask, the intrinsic amorphous silicon pattern of the second semiconductor pattern is formed under the data line and may protrude beyond the data line. The protrusion of the intrinsic amorphous silicon pattern may result in an image defect such as a wavy noise. In addition, since the active layer extends from the intrinsic amorphous silicon pattern of the second semiconductor pattern, a portion of the active layer is not covered by the gate electrode. Accordingly, an off current may be generated in the thin film transistor, which may degrade a property of the thin film transistor.

SUMMARY

In a first aspect, an array substrate for an in-plane switching mode liquid crystal display device includes: a gate line on a substrate; a data line crossing the gate line to define a pixel region on the substrate; a common line parallel to and spaced apart from the gate line; a gate electrode connected to the gate line; a semiconductor layer disposed over the gate electrode, wherein an area of the semiconductor layer is less than an area of the gate electrode; a source electrode connected to the data line, and a drain electrode spaced apart from the source electrode, the source and drain electrodes disposed on the semiconductor layer; a plurality of pixel electrodes integrated with the drain electrode and extending from the drain electrode in the pixel region; and a plurality of common electrodes connected to the common line and alternately arranged with the plurality of pixel electrodes, wherein each of the source electrode, the drain electrode, the data line and the plurality of pixel electrodes are comprised from a first conductive material layer and a second conductive material layer, wherein the second conductive material layer is disposed on the first conductive material layer.

In a second aspect, a method of fabricating an array substrate for an in-plane switching mode liquid crystal display device includes: forming a gate line, a gate electrode, a gate pad, a common line and a first common electrode on a substrate, the gate electrode extending from the gate line, the gate pad disposed at one end of the gate line, the common line substantially parallel to and spaced apart from the gate line, the first common electrode extending from the common line; forming a gate insulating layer on the gate line, the gate electrode, the gate pad, the common line and the first common electrode; forming a semiconductor layer on the gate insulating layer disposed over the gate electrode, the semiconductor layer having an area less than an area of the gate electrode; forming a data line, a source electrode, a drain electrode, a data pad, a gate pad terminal, a plurality of pixel electrodes and a second common electrode with a first conductive material layer on the semiconductor layer and a second conductive material layer on the first conductive material layer, the data line crossing the gate line, the source electrode extending from the data line, the drain electrode spaced apart from the source electrode, the data pad disposed at one end of the data line, the gate pad terminal, the plurality of pixel electrodes extending from the drain electrode, the second common electrode alternately arranged with the plurality of pixel electrodes; forming a passivation layer on the data line, the source electrode, the drain electrode, the data pad, the gate pad terminal, the plurality of pixel electrodes and the second common electrode; and forming an opening exposing the data pad at the passivation layer and an opening exposing the gate pad terminal at the passivation layer.

In a third aspect, a method of fabricating an array substrate for an in-plane switching mode liquid crystal display device includes: forming a gate line, a gate electrode, a gate pad, a common line and a plurality of common electrodes on a substrate having a pixel region, the gate electrode extending from the gate line, the gate pad disposed at one end of the gate line, the common line substantially parallel to and spaced apart from the gate line, the plurality of first common electrodes disposed in the pixel region and extending from the common line; forming a gate insulating layer on the gate line, the gate electrode, the gate pad, the common line and the first common electrode; forming a semiconductor layer on the gate insulating layer disposed over the gate electrode and having an island shape, the semiconductor layer having an area less than an area of the gate electrode; forming a data line, a source electrode, a drain electrode, a data pad, a gate pad terminal and a plurality of pixel electrodes with a first conductive material layer on the semiconductor layer and a second conductive material layer on the first conductive material layer, the data line crossing the gate line, the source electrode extending from the data line, the drain electrode spaced apart from the source electrode, the data pad disposed at one end of the data line, the gate pad terminal contacting the gate pad, the plurality of pixel electrodes extending from the drain electrode and alternately arranged with the plurality of common electrodes; forming a passivation layer on the data line, the source electrode, the drain electrode, the data pad, the gate pad terminal, the plurality of pixel electrodes and the plurality of common electrodes; and forming an opening exposing the data pad at the passivation layer and an opening the gate pad terminal at the passivation layer.

It is to be understood that both the foregoing general description and the following detailed description of the present invention are exemplary and explanatory and are intended to provide further explanation of the invention as claimed. Other systems, methods, features and advantages will be, or will become, apparent to one with skill in the art upon examination of the following figures and detailed description. It is intended that all such additional systems, methods, features and advantages be included within this description, be within the scope of the invention, and be protected by the following claims. Nothing in this section should be taken as a limitation on those claims. Further aspects and advantages are discussed below in conjunction with the embodiments.

BRIEF DESCRIPTION OF THE DRAWINGS

The system and/or method may be better understood with reference to the following drawings and description. Non-limiting and non-exhaustive embodiments are described with reference to the following drawings. The components in the figures are not necessarily to scale, emphasis instead being placed upon illustrating the principles of the invention. In the figures, like referenced numerals designate corresponding parts throughout the different views. The accompanying drawings, which are included to provide a further understanding of the invention and are incorporated in and constitute a part of this specification, illustrate embodiments of the invention and together with the description serve to explain the principle of the invention. In the drawings.

DETAILED DESCRIPTION OF THE EMBODIMENTS

Reference will now be made in detail to the embodiments of the present invention, examples of which are illustrated in the accompanying drawings. In an array substrate for an IPS mode LCD device fabricated through a four mask process according to the present embodiments, an active layer has an area less than a gate electrode and is not exposed to light from a backlight unit. Accordingly, an image degradation and an off current may be reduced or prevented.

Figure 1:
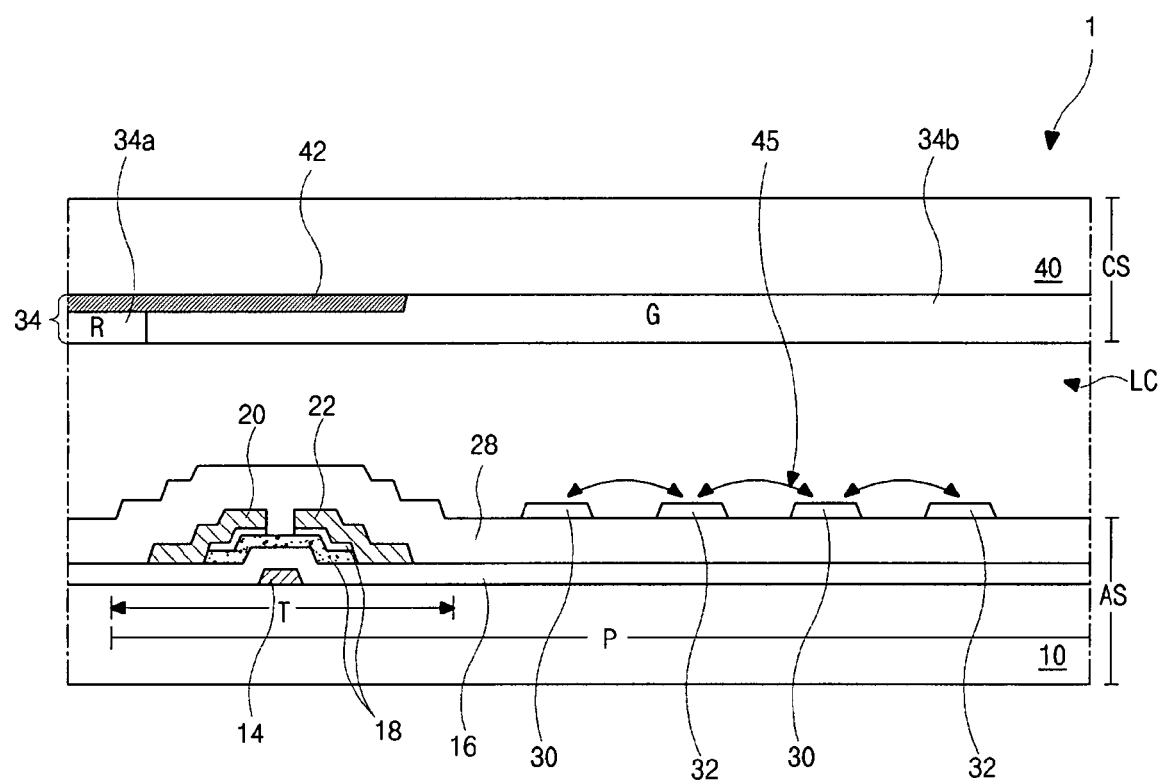
FIG. 1 is a schematic cross-sectional view of an IPS mode LCD device according to the related art.
Figure 2:
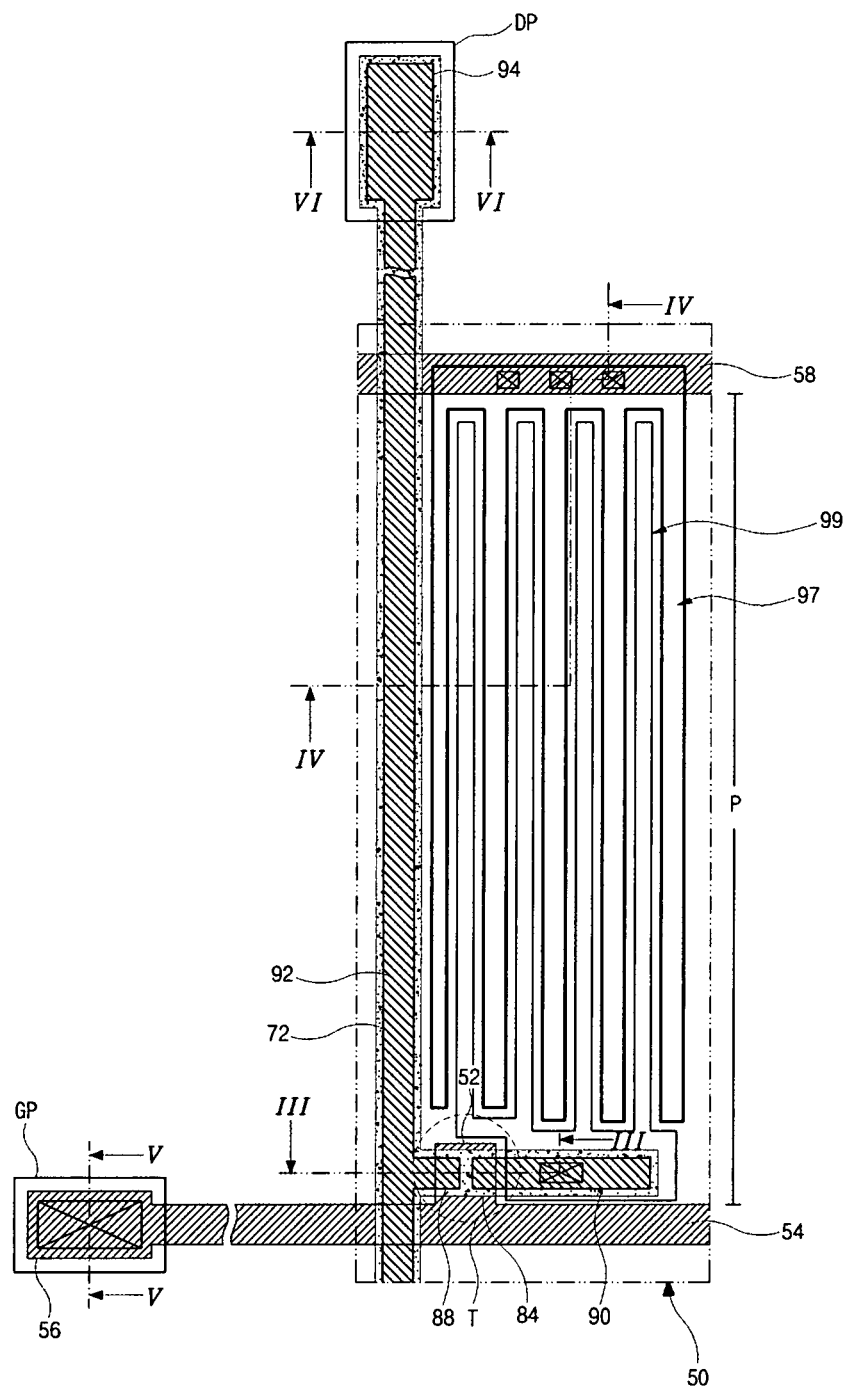
FIG. 2 is a schematic plan view of an array substrate for an IPS mode LCD device according to the related art.
Figure 3A:
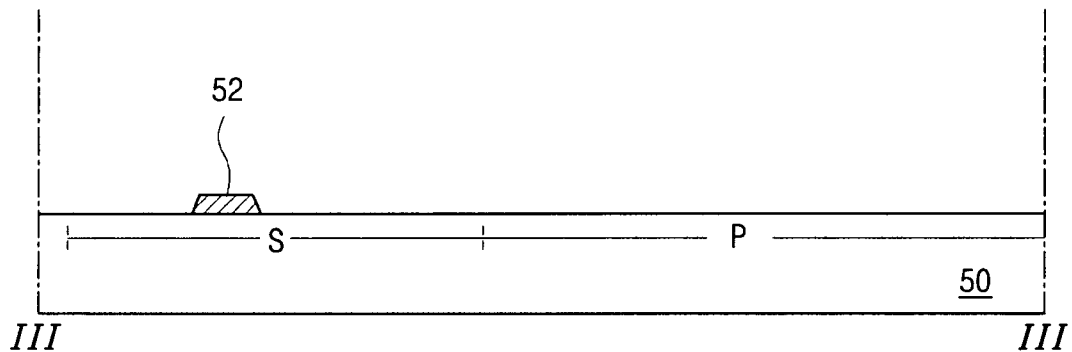
FIGS. 3A to 3H, FIGS. 4A to 4H, FIGS. 5A to 5H, and FIGS. 6A to 6H are schematic cross-sectional views taken along lines "III-III," "IV-IV," "V-V," "VI-VI" of FIG. 2, respectively, illustrating a fabricating process of an array substrate for an IPS mode LCD device according the related art.
Figure 3B:
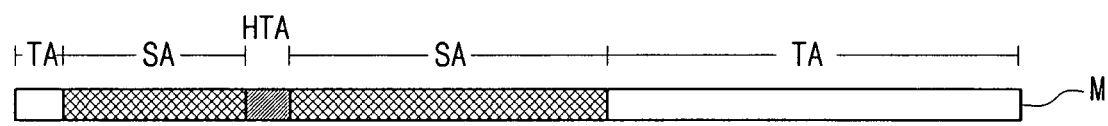
Figure 3B:
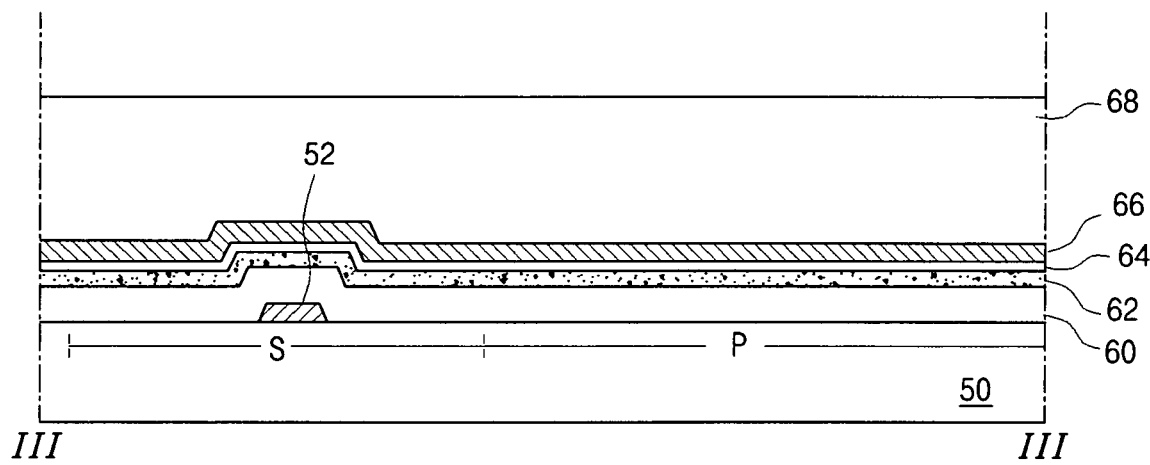
Figure 3C:
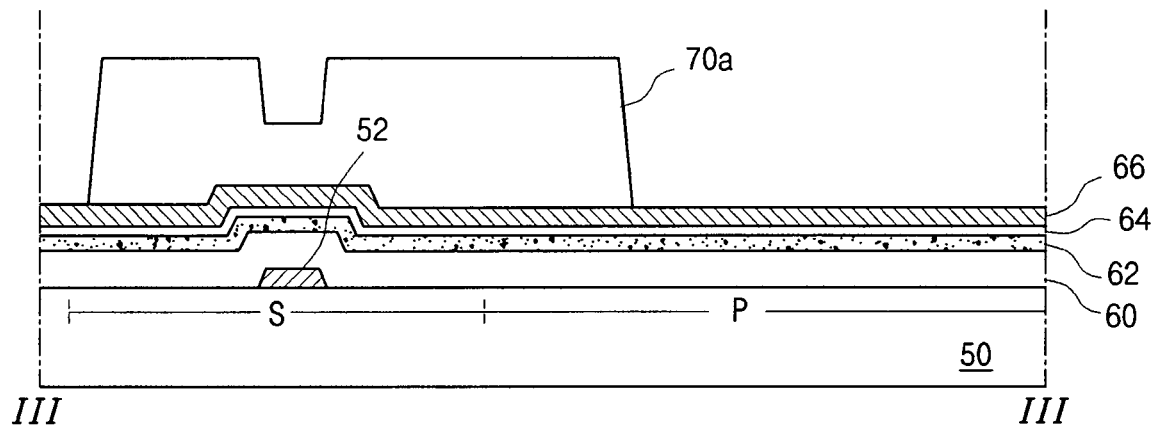
Figure 3D:
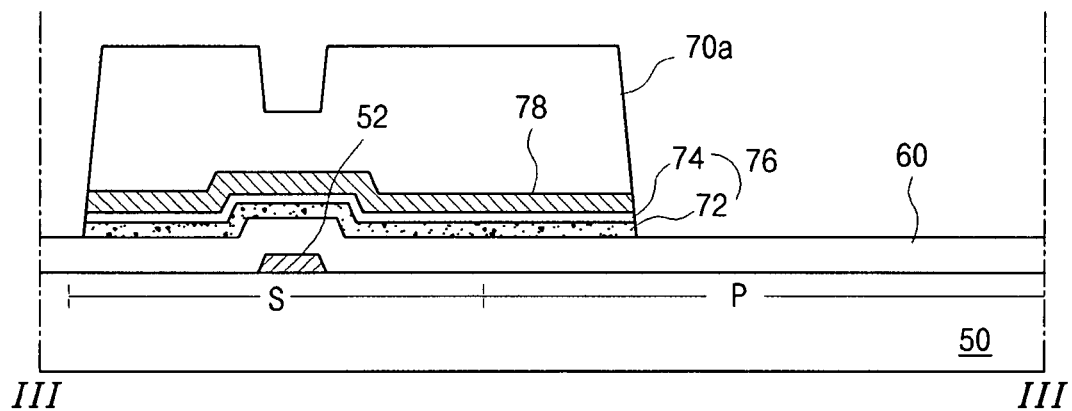
Figure 3E:
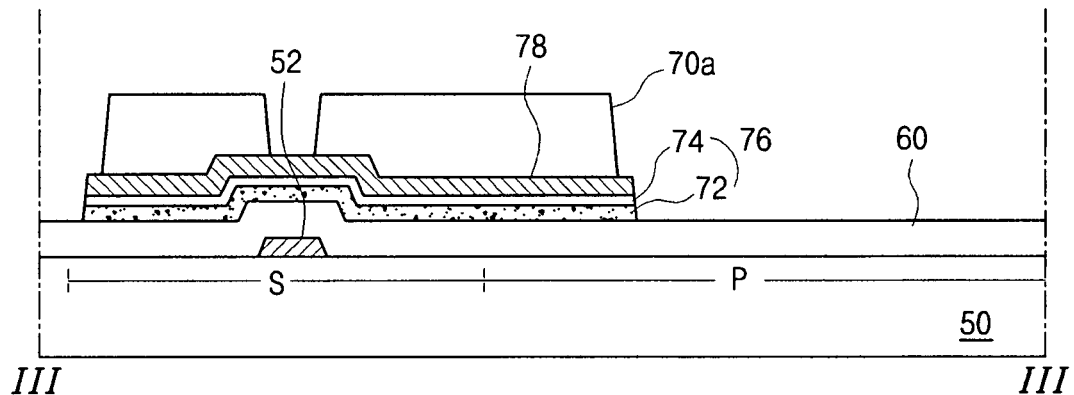
Figure 3F:
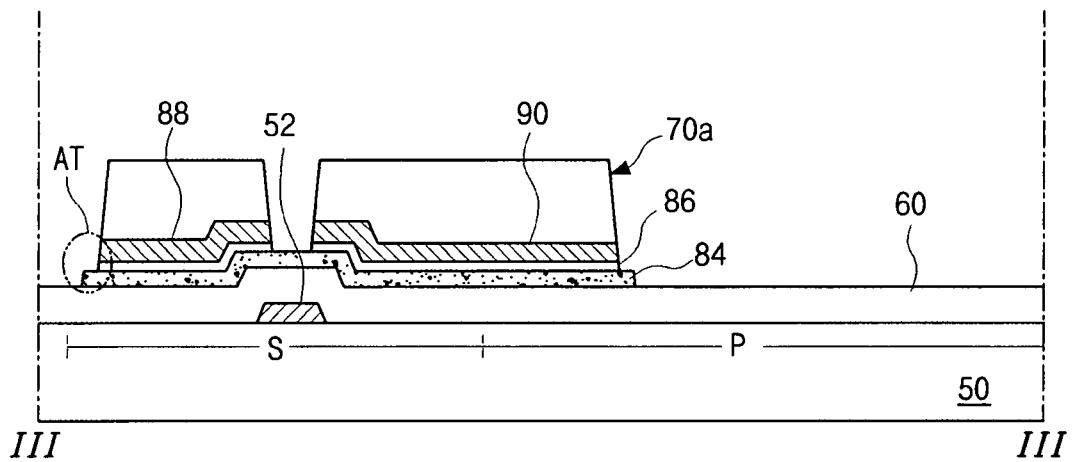
Figure 3G:
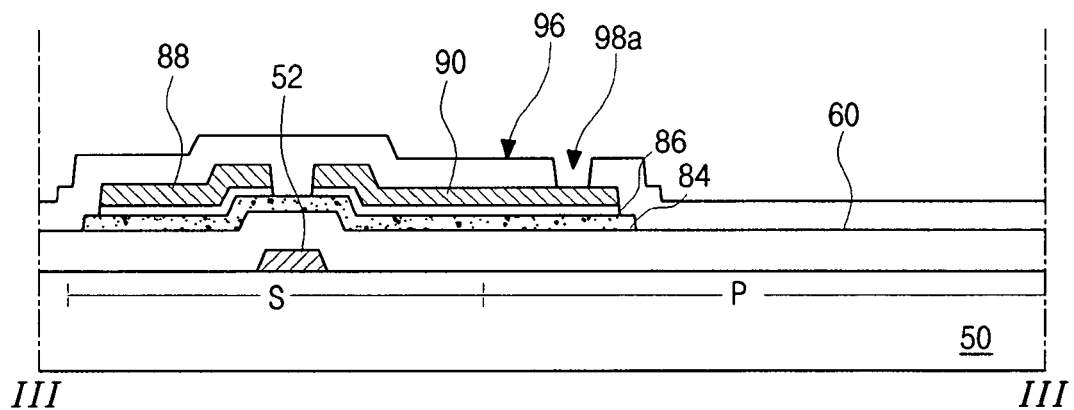
Figure 3H:
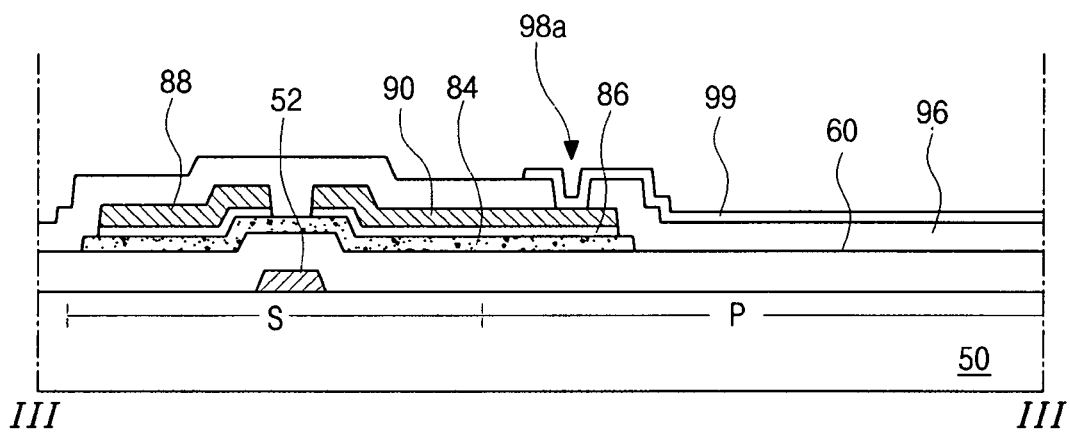
Figure 4A:
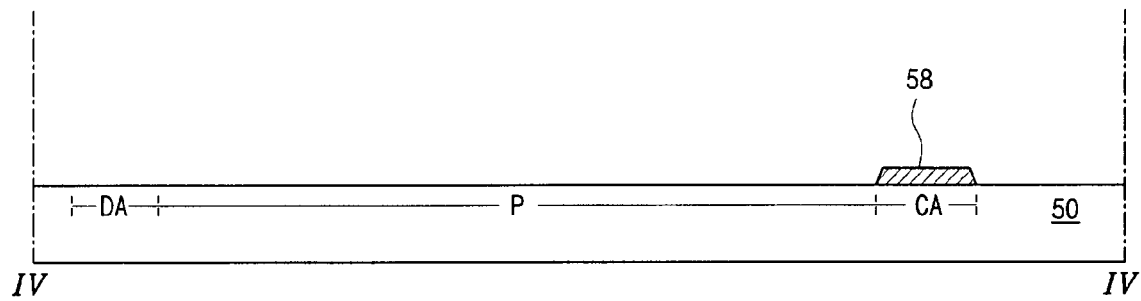
Figure 4B:
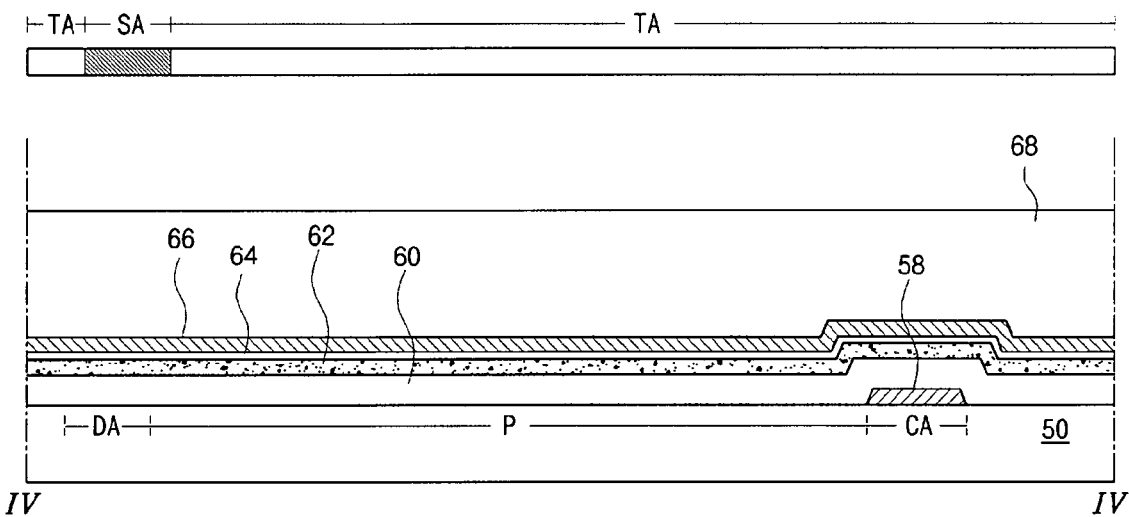
Figure 4C:
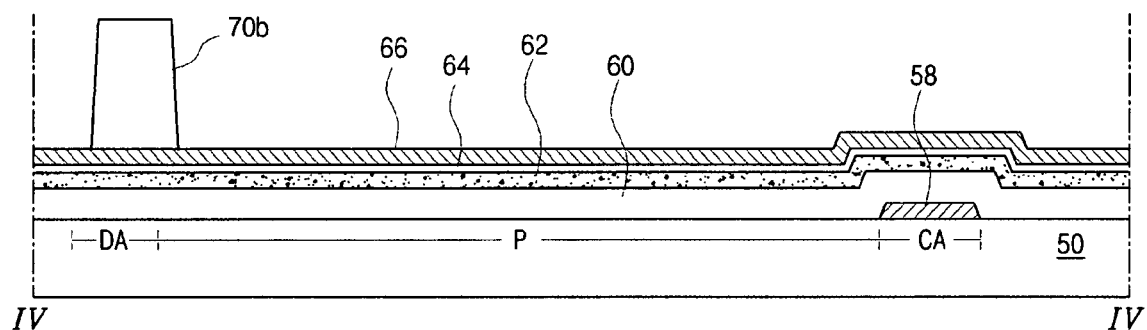
Figure 4D:
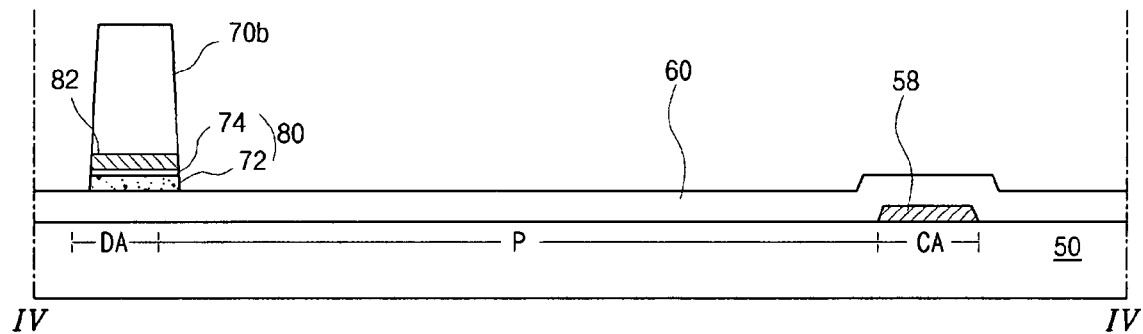
Figure 4E:
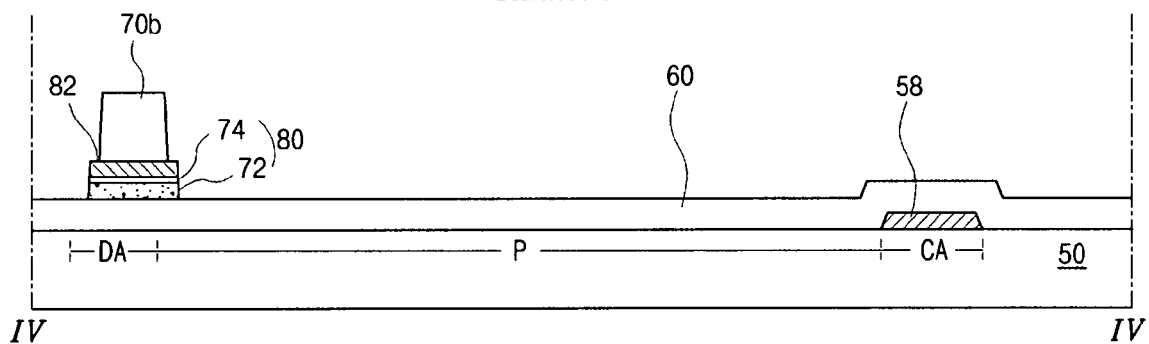
Figure 4F:
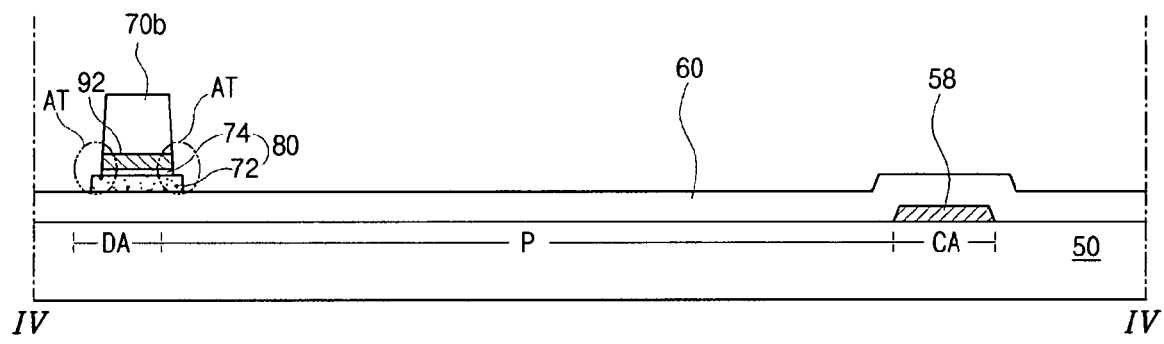
Figure 4G:
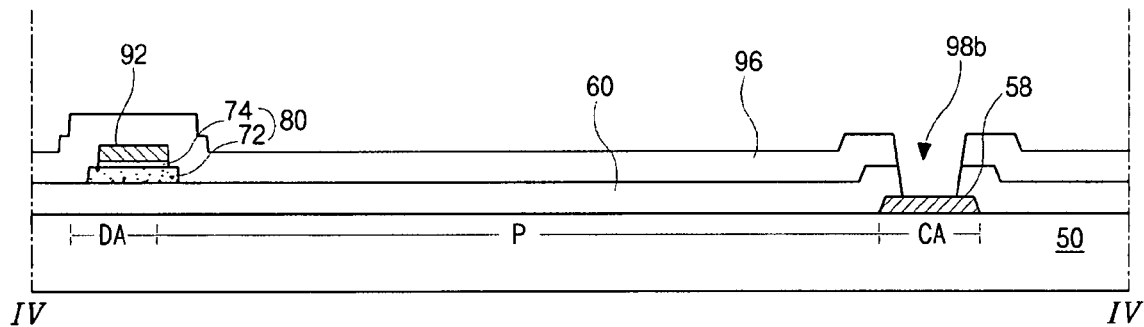
Figure 4H:
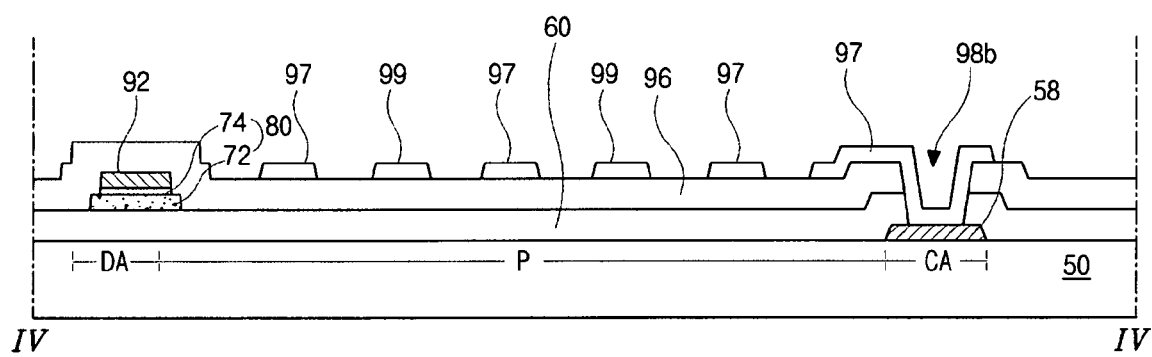
Figure 5A:
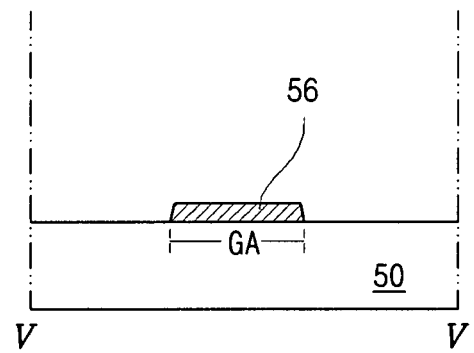
Figure 5B:
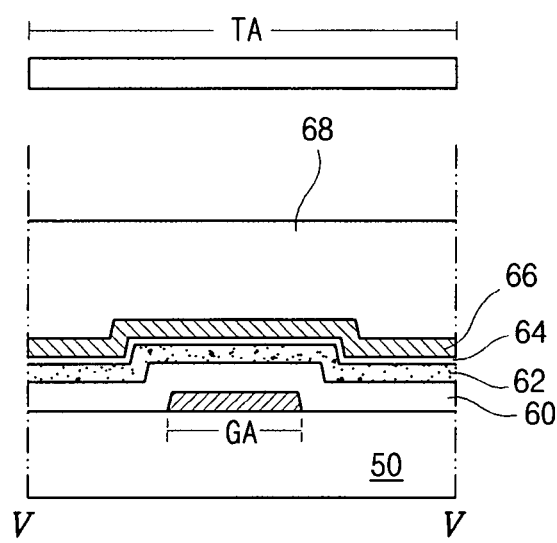
Figure 5C:
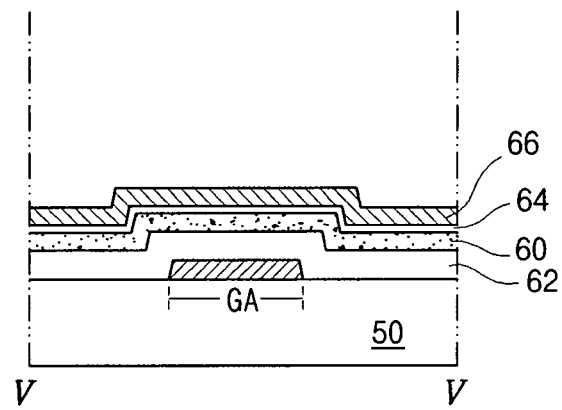
Figure 5D:
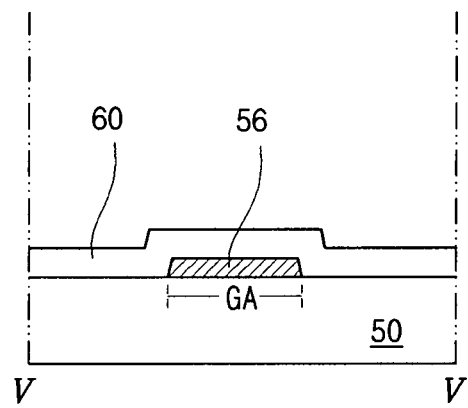
Figure 5E:
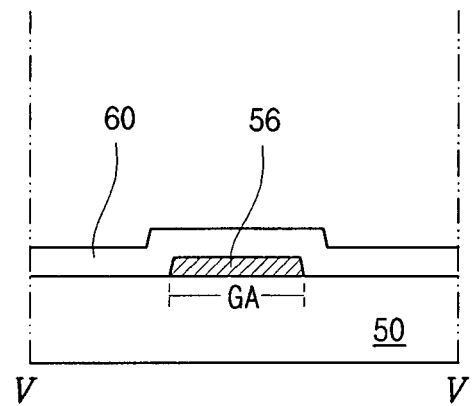
Figure 5F:
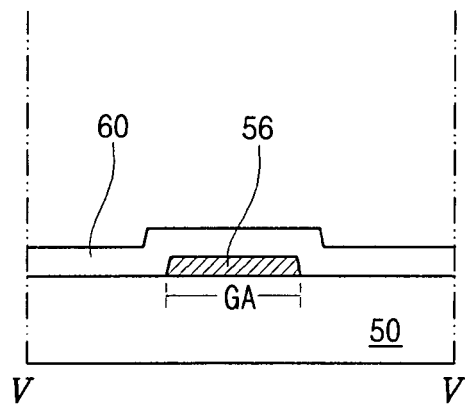
Figure 5G:
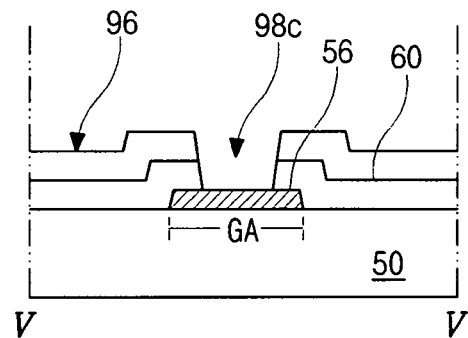
Figure 5H:
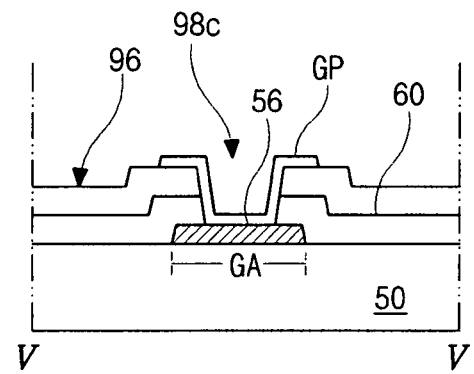
Figure 6A:
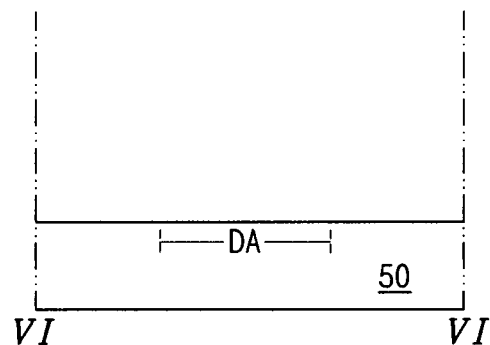
Figure 6B:
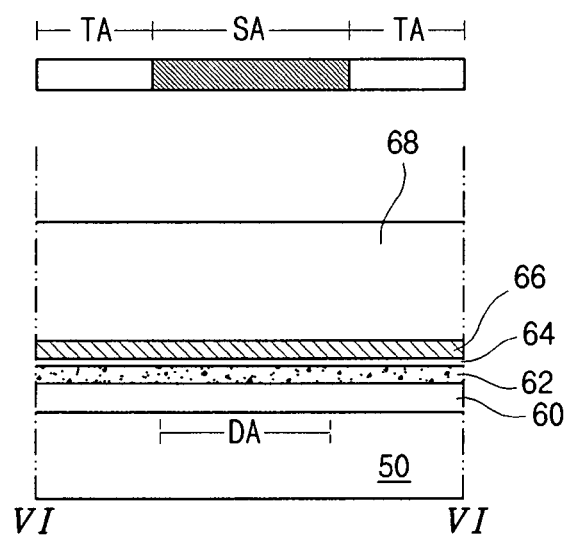
Figure 6C:
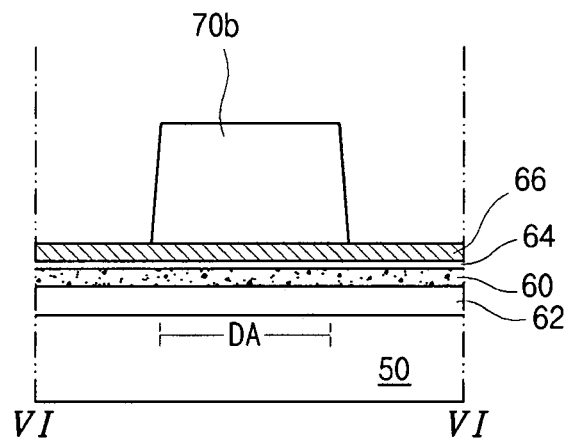
Figure 6D:
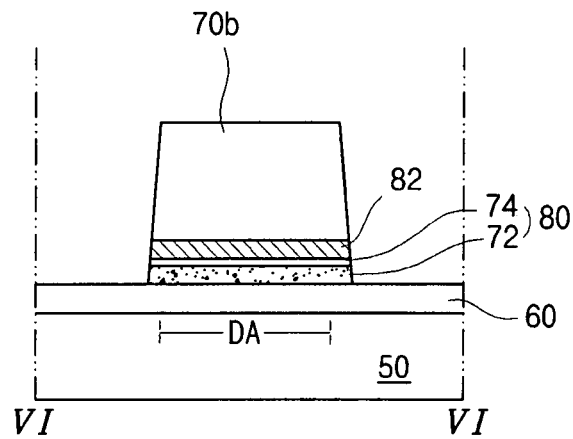
Figure 6E:
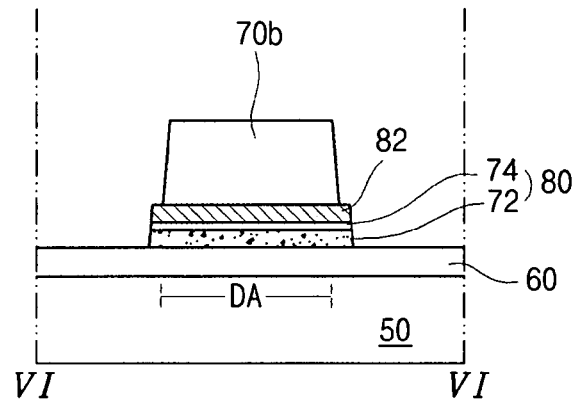
Figure 6F:
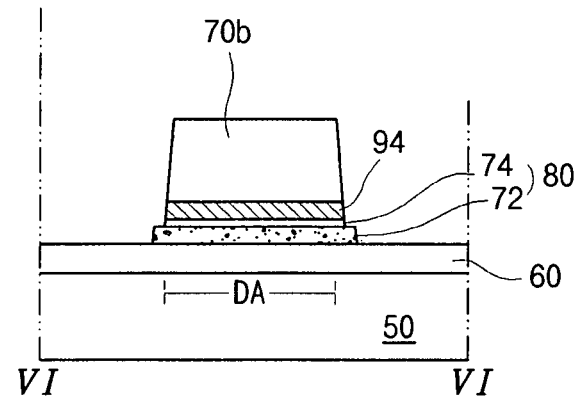
Figure 6G:
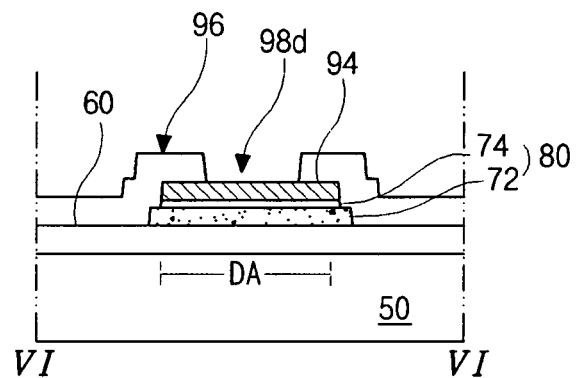
Figure 6H:
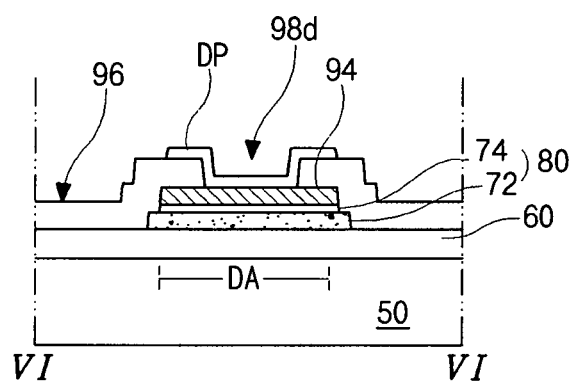
Figure 7:
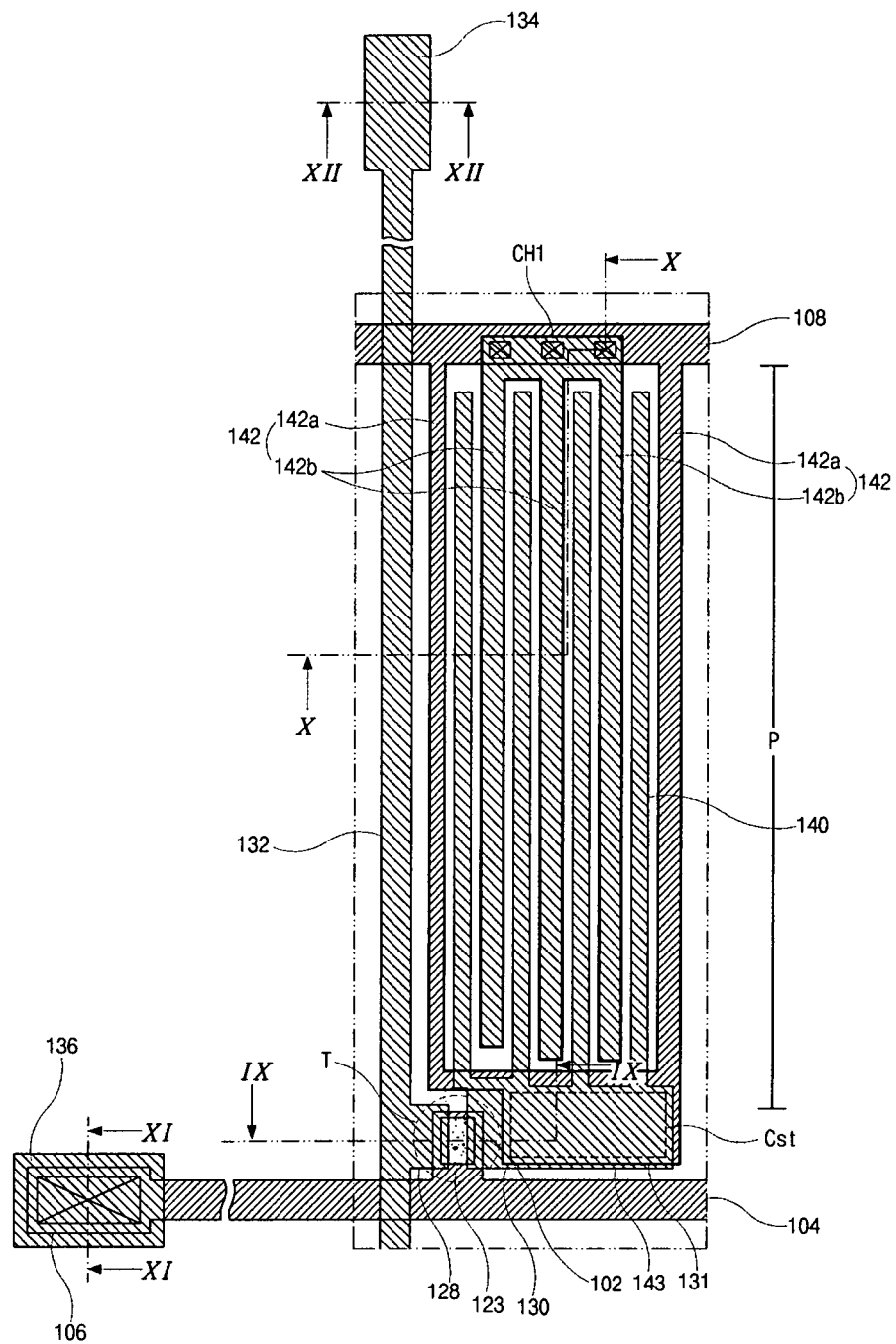
FIG. 7 is a schematic plan view of an array substrate for an IPS mode LCD device according to one embodiment.
Figure 8A:
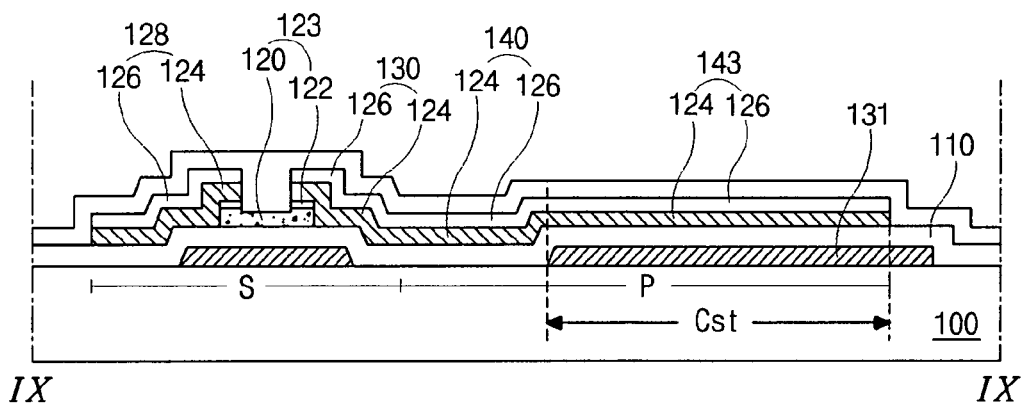
FIGS. 8A to 8D are cross-sectional views taken along lines "IX-IX," "X-X," "XI-XI," "XII-XII" of FIG. 7, respectively, according to one embodiment.
Figure 8B:
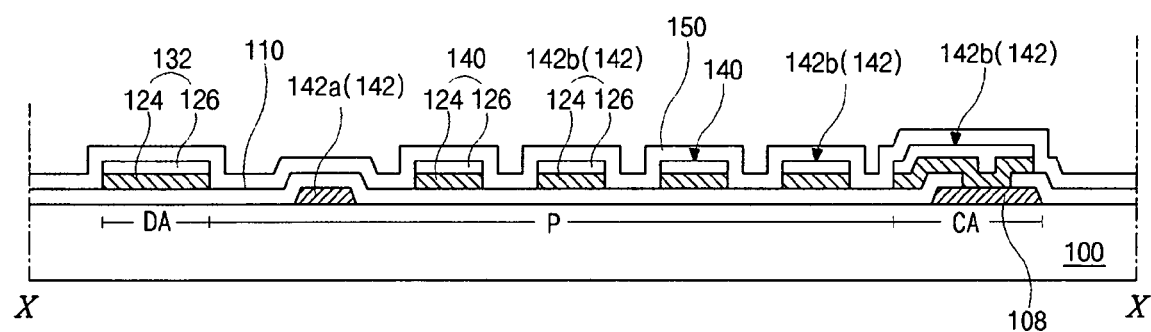
Figure 8C:
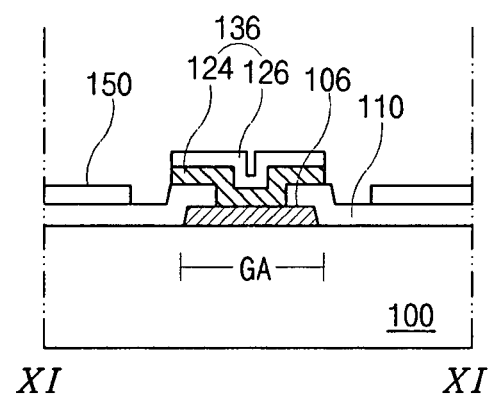
Figure 8D:
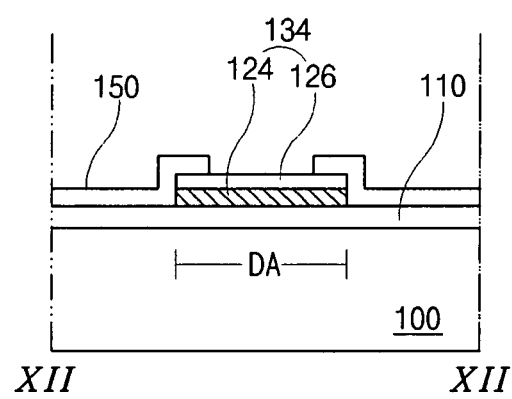
Figure 9A:
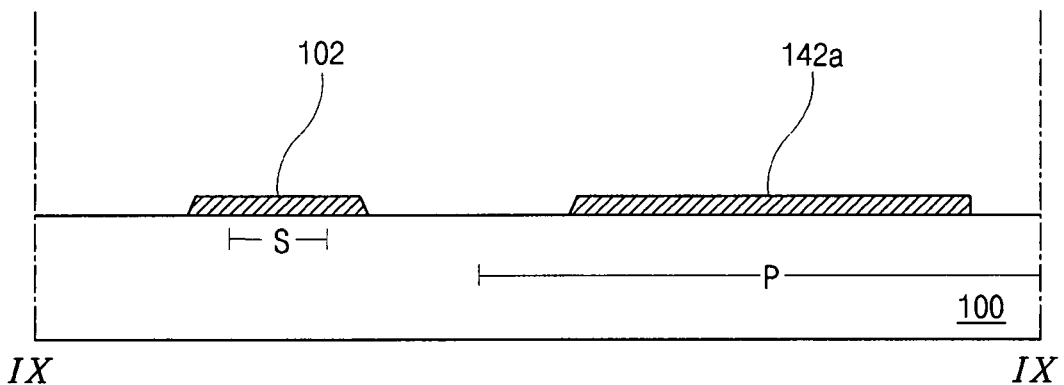
FIGS. 9A to 9G, FIGS. 10A to 10G, FIGS. 11A to 11G, and FIGS. 12A to 12G are schematic cross-sectional views taken along lines "IX-IX," "X-X," "XI-XI," "XII-XII" of FIG. 7, respectively, showing a fabricating process of an array substrate for an IPS mode LCD device according to one embodiment.
Figure 9B:
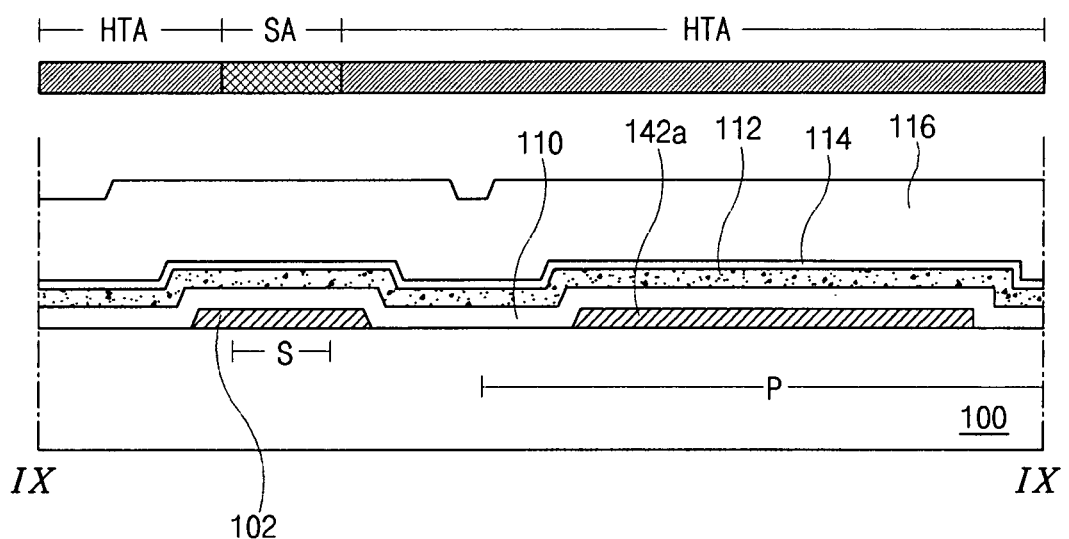
Figure 9C:
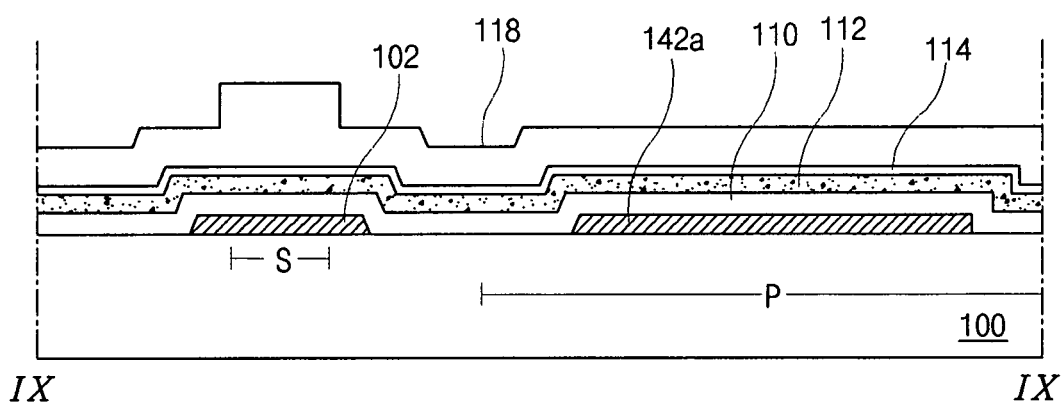
Figure 9D:
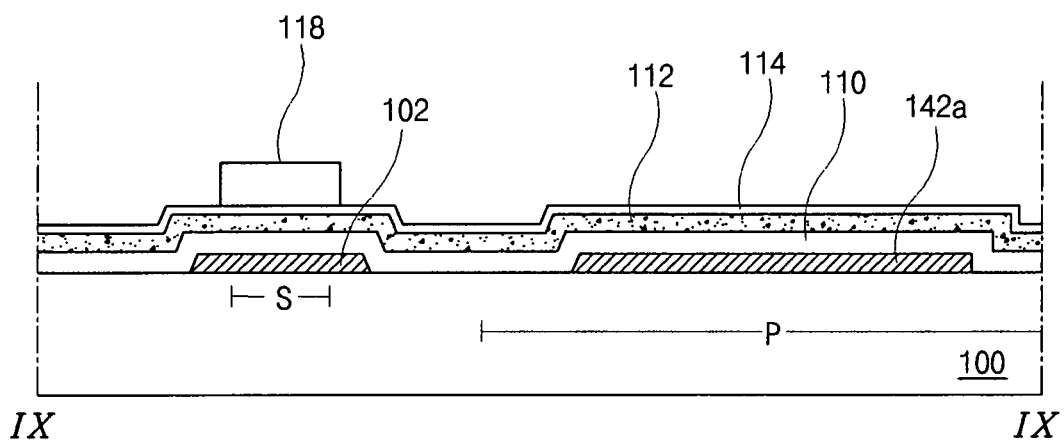
Figure 9E:
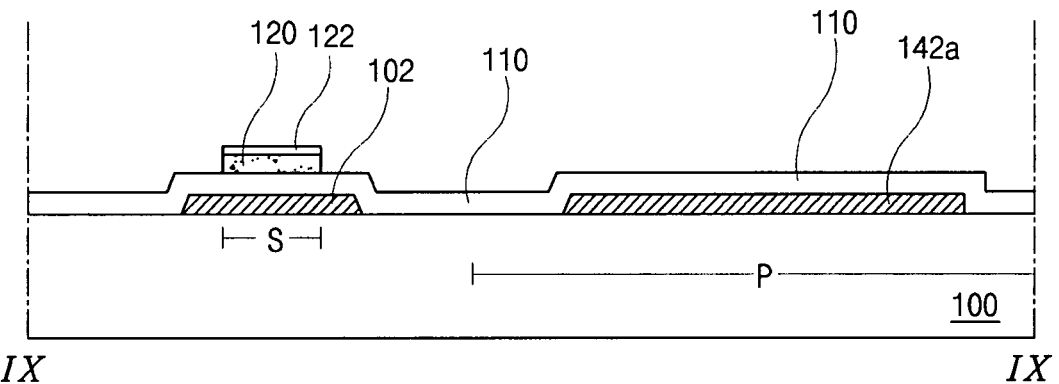
Figure 9F:
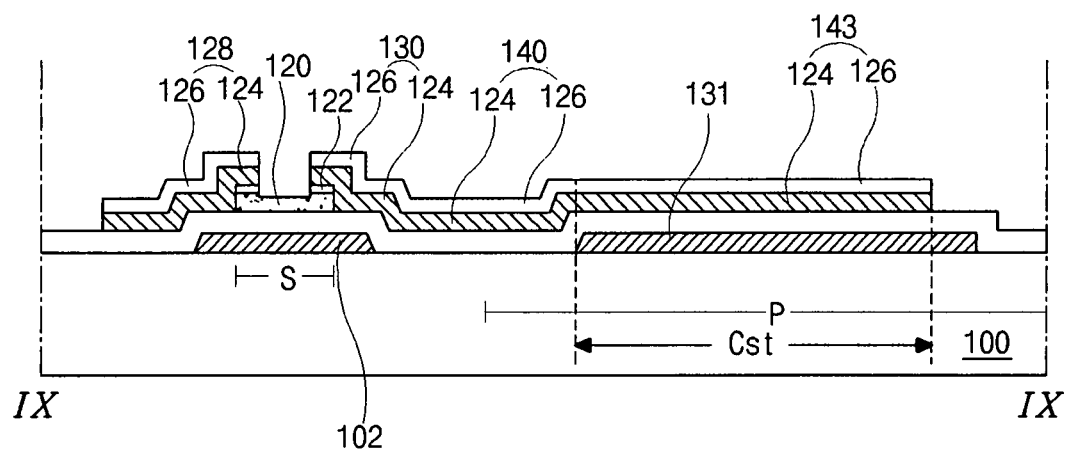
Figure 9G:
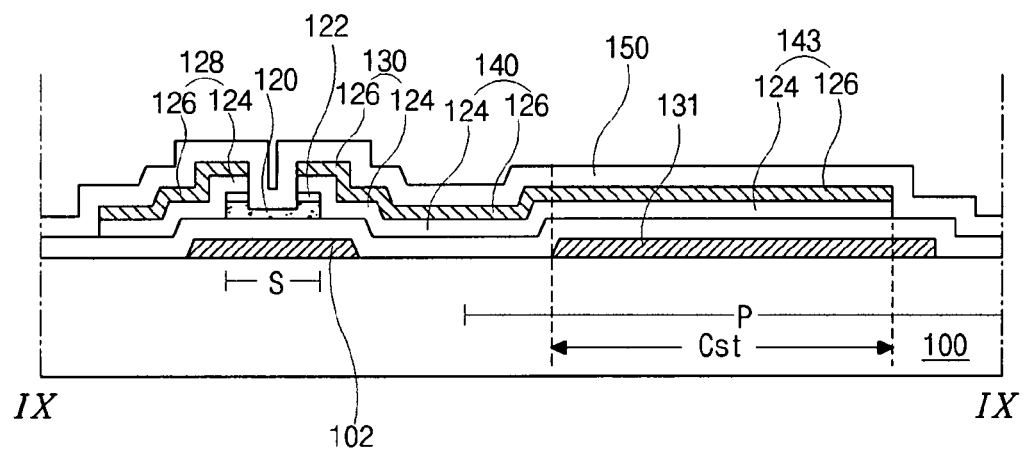
Figure 10A:
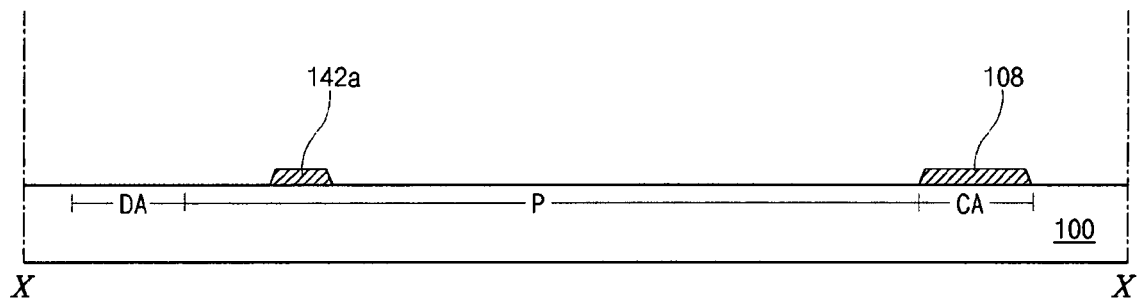
Figure 10B:
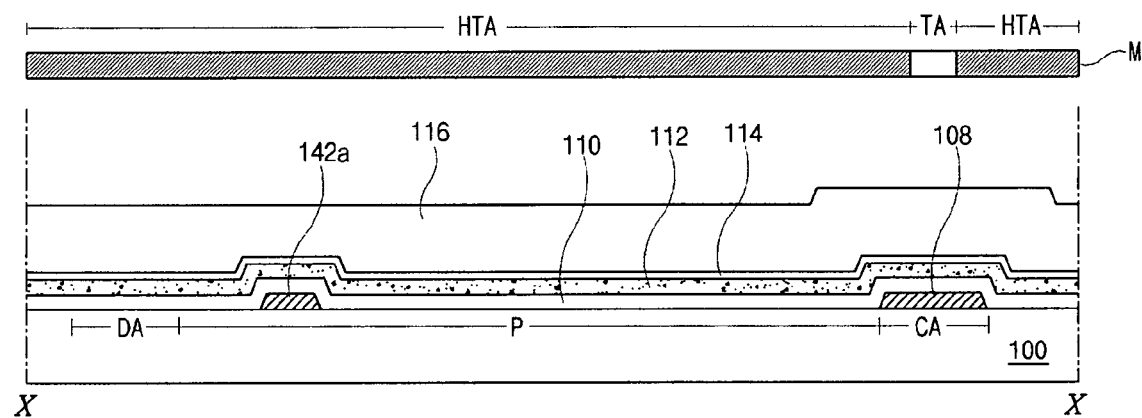
Figure 10C:
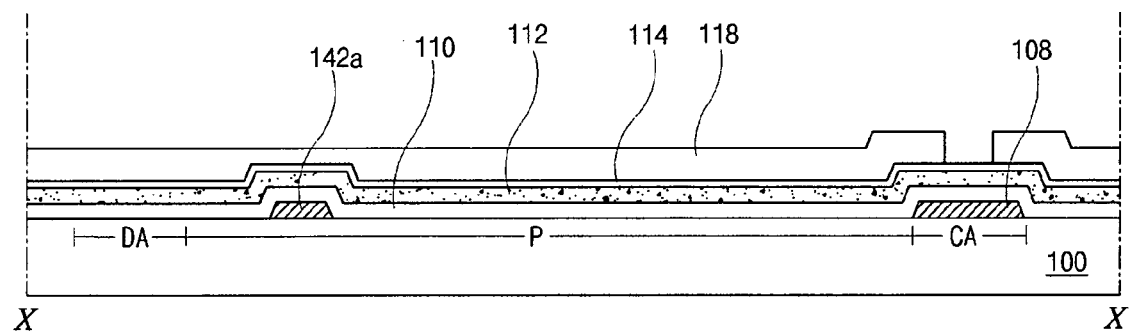
Figure 10D:
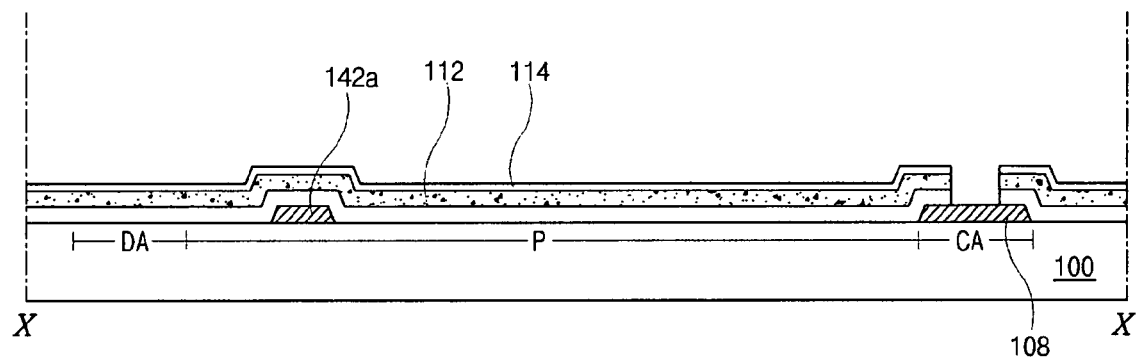
Figure 10E:
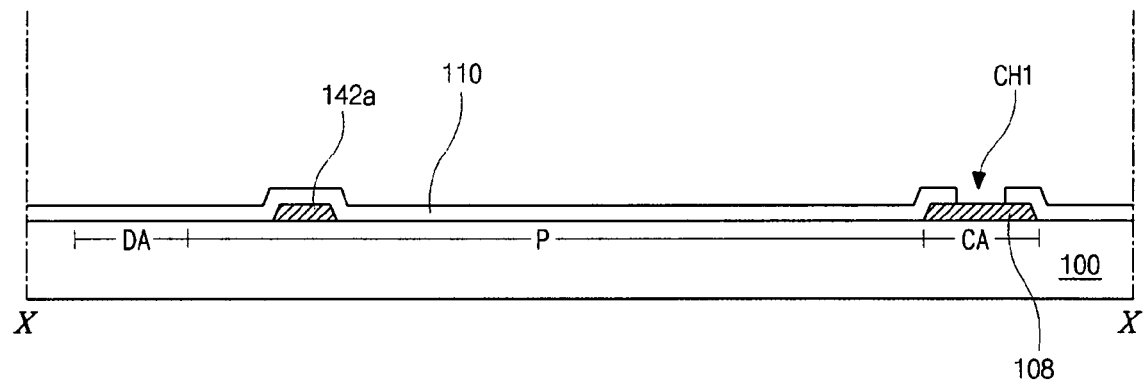
Figure 10F:
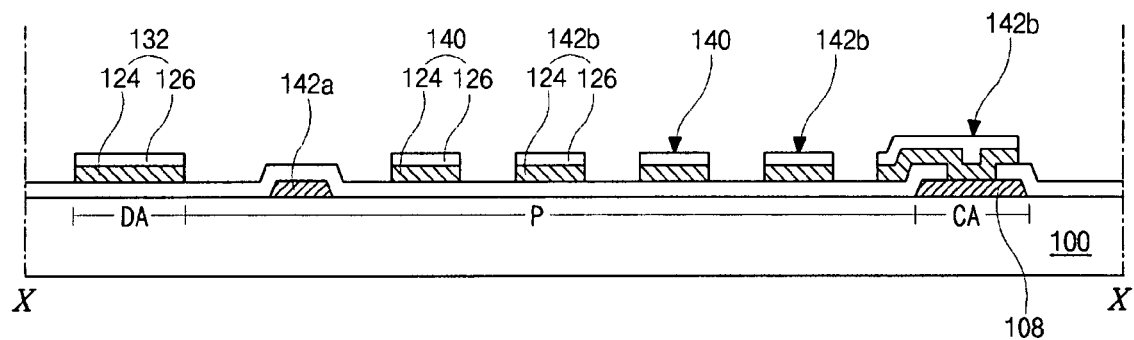
Figure 10G:
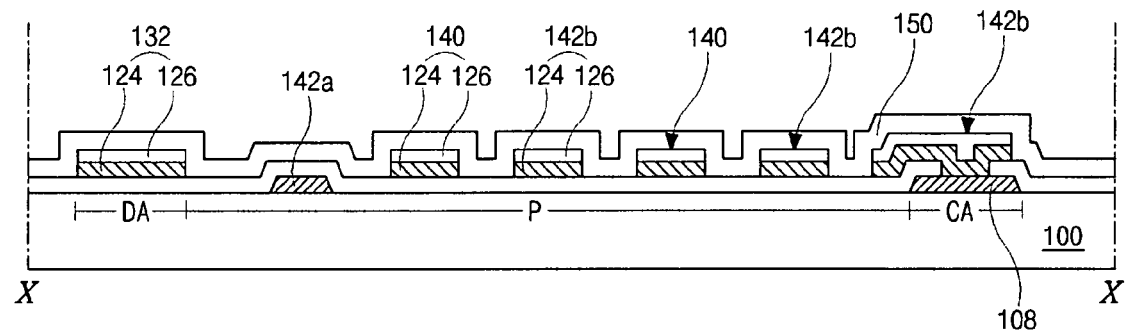
Figure 11A:
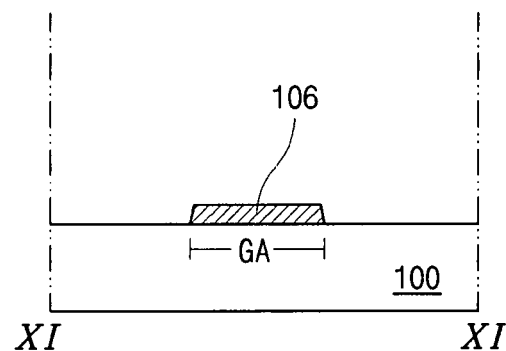
Figure 11B:
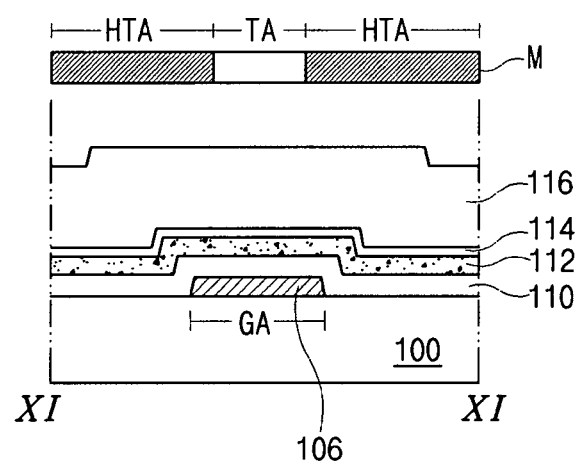
Figure 11C:
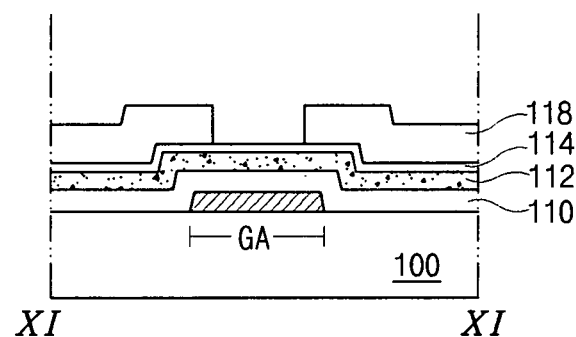
Figure 11D:
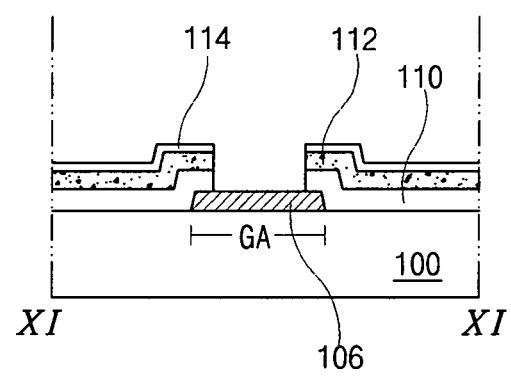
Figure 11E:
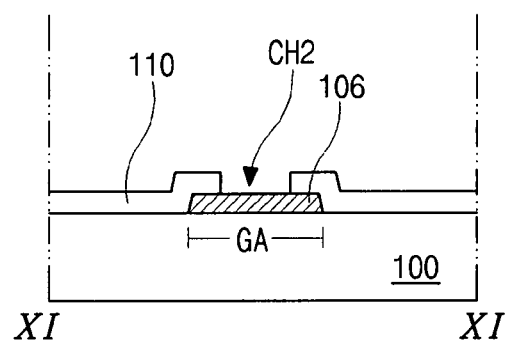
Figure 11F:
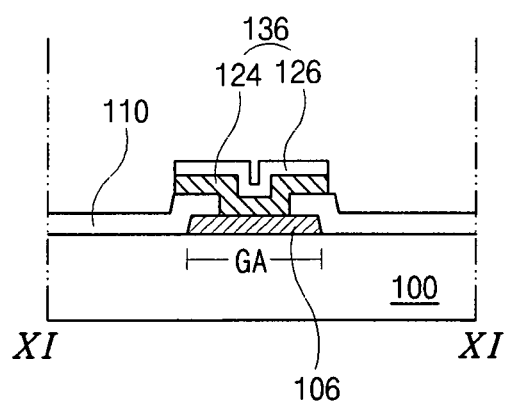
Figure 11G:
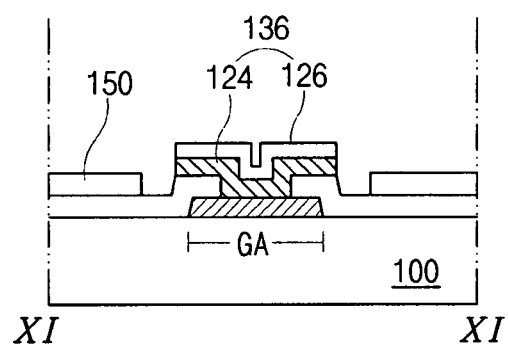
Figure 12A:
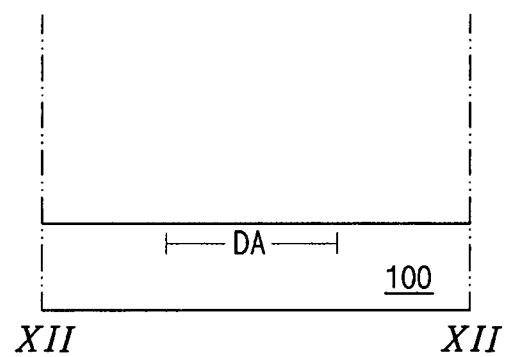
Figure 12B:
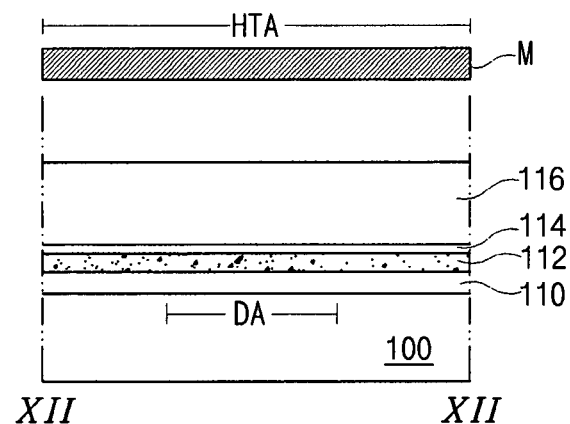
Figure 12C:
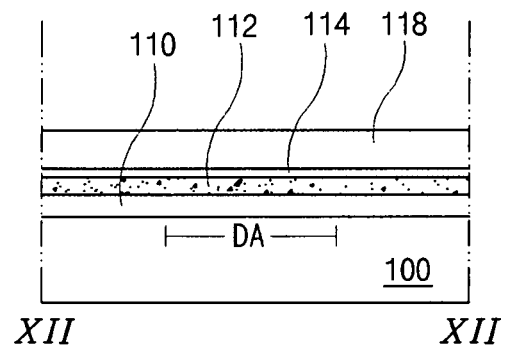
Figure 12D:
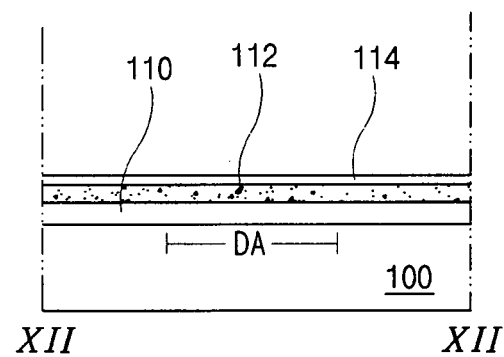
Figure 12E:
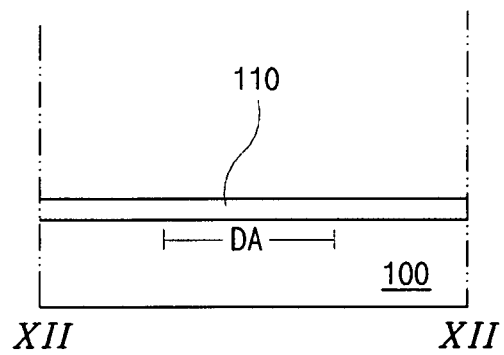
Figure 12F:
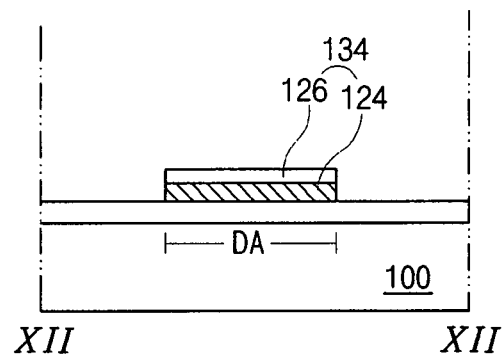
Figure 12G:
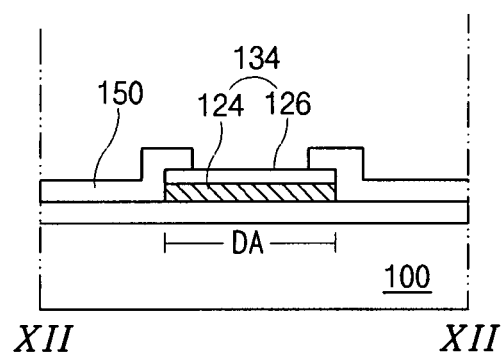

FIG. 7 is a schematic plan view of an array substrate for an IPS mode LCD device according to one embodiment. As shown in FIG. 7, a gate line 104 along a first direction and a data line 132 along a second direction cross each other to define a pixel region P. A common line 108 is parallel to and spaced apart from the gate line 104. A thin film transistor (TFT) T including a gate electrode 102, a semiconductor layer 123, a source electrode 128 and a drain electrode 130 is disposed at a crossing of the gate and data lines 104 and 132. A plurality of pixel electrodes 140 connected to the drain electrode 130 are disposed in the pixel region P. A plurality of common electrodes 142, which are connected to the common line 108 and alternately arranged with the plurality of pixel electrodes 140, are disposed in the pixel region P. The plurality of pixel electrodes 140 and the plurality of common electrodes 142 are substantially parallel to the data line 132.

The plurality of common electrodes 142 include a first common electrode 142a and a second common electrode 142b. The first common electrode 142a extends from the common line 108 and disposed at boundary portions of the pixel region P. The second common electrode 142b is disposed at a central position of the pixel region P and connected to the common line 108 via a first contact hole CH1. A portion of the pixel electrode 140 overlaps a portion of the first common electrode 142a to form a storage capacitor Cst. An overlapped portion of the first common electrode 142a functions as a first capacitor electrode 131. An overlapped portion of the pixel electrode 140 functions as a second capacitor electrode 143. The gate insulating layer (not shown) between the first and second capacitor electrodes 131 and 143 functions as a dielectric material. The first capacitor electrode 131, the second capacitor electrode 143 and the gate insulating layer constitute the storage capacitor Cst. Moreover, a gate pad 106 is disposed at one end of the gate line 104, and a gate pad terminal 136 is disposed on the gate pad 106. A data pad 134 is disposed at one end of the data line 132.

An array substrate for an IPS mode LCD device is fabricated through a four mask process according to the present embodiments. Since the source and drain electrodes 128 and 130 have a double-layered structure of an opaque metallic material and a transparent conductive material, the data pad 134 may function as both a data pad and a data pad terminal. In addition, since the semiconductor layer 123 has an area less than the gate electrode 102, an active layer of amorphous silicon of the semiconductor layer 123 is not exposed to light. Accordingly, because there is no exposure to light of the active layer of amorphous silicon, there is no off current in the TFT T. In particular, the semiconductor layer 123 is disposed within the gate electrode 102. Since the semiconductor layer 123 is not formed under the data line 132, a defect in the image, such as a wavy noise is not generated.

The plurality of common electrodes 142 include the first common electrode 142a disposed at boundary portions of the pixel region P and the second common electrode 142b connected to the common line 108 through the first contact hole CH1. The first common electrode 142a is formed at the same layer and of the same material as the gate line 104. The second common electrode 142b is formed at the same layer and of the same material as the pixel electrodes 140. Since a single layer of the gate insulating layer (not shown) functions as a dielectric material in the storage capacitor Cst, the storage capacitor Cst has sufficient storage capacitance and aperture ratio is improved.

FIGS. 8A to 8D are schematic cross-sectional views taken along lines "IX-IX," "X-X," "XI-XI," "XII-XII" of FIG. 7, respectively, according to an embodiment. As shown in FIGS. 8A to 8D, a substrate 100 includes a pixel region P, a gate region GA, a data region DA, a switching region S and a common signal region CA. A thin film transistor (TFT) T includes a gate electrode 102 on the substrate 100, a gate insulating layer 110 on the gate electrode 102, an active layer 120 on the gate insulating layer 110, an ohmic contact layer 122 on the active layer 120, a source electrode 128 on the active layer 120, and a drain electrode 130 disposed at the switching region S. The active layer 120 and the ohmic contact layer 122 constitute a semiconductor layer 123.

The source and drain electrodes 128 and 130 are disposed on the ohmic contact layer 122 and spaced apart from one another. Each of the source and drain electrodes 128 and 130 has a double layered structure of first and second conductive material layers 124 and 126. The first conductive material layer 124 may be formed of a metallic material, such as molybdenum (Mo), titanium (Ti), tantalum (Ta), tungsten (W), copper (Cu) or aluminum neodymium (AlNd). The second conductive material layer 126 may be formed of a transparent conductive material, such as indium-tin-oxide (ITO) or indium-zinc-oxide (IZO).

A data line 132 that is connected to the source electrode 128 and a data pad 134 that is disposed at one end of the data line 132 are disposed in the data region DA. The data line 132 and the data pad 134 also include the first and second conductive material layers 124 and 126. A gate line (not shown) that is connected to the gate electrode 102 crosses the data line 132 to define the pixel region P. A gate pad 106 in the gate region GA is disposed at one end of the gate line (not shown). A gate pad terminal 136 contacts the gate pad 106 and also includes the first and second conductive material layers 124 and 126.

A plurality of pixel electrodes 140 extend from the drain electrode 130 and are disposed in the pixel region P. A plurality of common electrodes 142 are connected to the common line 108 and alternately arranged with the plurality of pixel electrodes 140. The plurality of common electrodes 142 are disposed in the pixel region P and include a first common electrode 142a and a second common electrode 142b. The first common electrode 142a is disposed at boundary portions of the pixel region P. The second common electrode 142b is disposed at a central position of the pixel region P. The second common electrode 142b also includes the first and second conductive material layers 124 and 126.

The pixel electrode 140 overlaps the first common electrode 142a to form a storage capacitor Cst. An overlapped portion of the first common electrode 142a functions as a first capacitor electrode 131. An overlapped portion of the pixel electrode 140 functions as a second capacitor electrode 143. The gate insulating layer 110 between the first and second capacitor electrodes 131 and 143 functions as a dielectric material. The first capacitor electrode 131, the second capacitor electrode 143 and the gate insulating layer constitute the storage capacitor Cst.

In the array substrate for the IPS mode LCD device, an intrinsic amorphous silicon layer and an impurity-doped amorphous silicon layer respectively extending from the active layer 120 and the ohmic contact layer 122 are not disposed under the data line 132. Accordingly, there is a reduction in image defects, such as a wavy noise. In addition, since the active layer 120 has an area less than the gate electrode 102, the active layer 120 is not exposed to light so that an off current is not generated in the TFT T.

FIGS. 9A to 9G, FIGS. 10A to 10G, FIGS. 11A to 11G, and FIGS. 12A to 12G are schematic cross-sectional views taken along lines "IX-IX," "X-X," "XI-XI," "XII-XII" of FIG. 7, respectively, showing a fabricating process of an array substrate for an IPS mode LCD device according an embodiment. FIGS. 9A to 9G show a thin film transistor (TFT) and a storage capacitor, FIGS. 10A to 10G show a pixel region P, FIGS. 11A to 11G show a gate pad, and FIGS. 12A to 12G show a data pad.

FIGS. 9A, 10A, 11A and 12A show a first mask process. As shown in FIGS. 9A, 10A, 11A and 12A, a substrate 100 includes a pixel region P, a gate region GA, a data region DA, a switching region S and a common signal region CA. A first conductive metal layer (not shown) is formed on the substrate 100 by depositing at least one of a conductive metallic material, such as aluminum (Al), aluminum neodymium (AlNd), chromium (Cr), molybdenum (Mo), tungsten (W), titanium (Ti), copper (cu) or tantalum (Ta). The first conductive metal layer (not shown) is etched through a first mask process to form a gate electrode 102, a gate line 104 (of FIG. 7), and a gate pad 106 at one end of the gate line 104 (of FIG. 7). The gate electrode 102 is disposed in the switching region S. The gate line 104 (of FIG. 7) and the gate pad 106 are disposed in the gate region GA. A common line 108 that is parallel to and spaced apart from the gate line 107 (of FIG. 7) is disposed in the common signal region CA.

FIGS. 9B to 9E, 10B to 10E, 11B to 11E and 12B to 12E show a second mask process. As shown in FIGS. 9B, 10B, 11B and 12B, a gate insulating layer 110, an intrinsic amorphous silicon layer 112, an impurity-doped amorphous silicon layer 114 and a photosensitive material layer 116 are sequentially formed on the gate electrode 102, the gate pad 106 and the common line 108. The gate insulating layer 110 is formed by depositing at least one of an inorganic insulating material such as silicon nitride (SiNx) or silicon oxide (SiOx). The photosensitive material layer 116 is formed by coating a photoresist.

A mask M having a transmitting area TA, a shielding area SA and a half-transmitting area HTA is disposed over the photosensitive material layer 116. As discussed above, a transmittance of the half-transmitting area HTA is smaller than that of the transmitting area TA and is greater than that of the shielding area SA. The shielding area SA corresponds to the switching region S, and the transmitting area TA corresponds to the gate pad 106. The transmitting area TA partially corresponds to the common signal region CA. The half-transmitting area HTA corresponds to other portions. The shielding area SA has an area less than the gate electrode 102. The photosensitive material layer 116 is exposed through the mask M.

As shown in FIGS. 9C, 10C, 11C and 12C, the photosensitive material layer 116 (of FIGS. 9B, 10B, 11B and 12B) is patterned to form a photosensitive pattern 118 on the impurity-doped amorphous silicon layer 114. Since a portion of the photosensitive pattern 118 corresponds to the shielding area SA of the mask M, the portion of the photosensitive pattern 118 in the switching region S has a relatively higher thickness than other portions. The photosensitive material layer 116 (of FIGS. 9B, 10B, 11B and 12B) corresponding to a portion of the common line 108 and the gate pad 106 is removed to expose the impurity-doped amorphous silicon layer 114.

As shown in FIGS. 9D, 10D, 11D and 12D, the impurity-doped amorphous silicon layer 114, the intrinsic amorphous silicon layer 112 and the gate insulating layer 110 are etched using the photosensitive pattern 118 as an etching mask to expose a portion of the common line 108 and a portion of the gate pad 106. The photosensitive pattern 118 is ashed to expose the impurity-doped amorphous silicon layer 114. The photosensitive pattern 118 in the switching region S is partially removed such that the impurity-doped amorphous silicon layer 114 in the switching region S is not exposed. However, the photosensitive pattern 118 in other regions is removed so that the impurity-doped amorphous silicon layer 114 in the other regions is exposed.

As shown in FIGS. 9E, 10E, 11E and 12E, the impurity-doped amorphous silicon layer 114 and the intrinsic amorphous silicon layer 112 of (of FIGS. 9D, 10D, 11D and 12D) is patterned using the photosensitive pattern 118 (of FIGS. 9D, 10D, 11D and 12D) as a pattering mask to form an active layer 120 and an ohmic contact layer 122 on the active layer 120. The active layer 120 and the ohmic contact layer 122 are disposed over the gate electrode 102.

FIGS. 9F, 10F, 11F and 12F show a third mask process. As shown in FIGS. 9F, 10F, 11F and 12F, first and second conductive metallic material layers (not shown) are on the ohmic contact layer 122. The first and second conductive metallic material layers (not shown) are etched through a third mask process to form a source electrode 128, a drain electrode 130, a plurality of pixel electrodes 140 and a second common electrode 142b. The source and drain electrodes 128 and 130 are disposed in the switching region S and spaced apart from one another. The plurality of pixel electrodes 140 and the second common electrode 142b are disposed in the pixel region P. Each of the source electrode 128, the drain electrode 130, the plurality of pixel electrodes 140 and the second common electrode 142b has a double-layered structure of a first conductive material layer 124 and a second conductive material layer 126. The plurality of pixel electrodes 140 extend from the drain electrode 130, and each has a bar shape. The second common electrode 142b is connected to the common line 108 and alternately arranged with the plurality of pixel electrodes 140. The plurality of pixel electrodes 140, the first common electrode 142a and the second common electrode 142b are substantially parallel to the data line 132. The plurality of pixel electrodes 140, the first common electrode 142a and the second common electrode 142b may have various shapes. A gate pad terminal 136 has a first conductive material layer 124 and a second conductive material layer 126 is formed on and contacts the gate pad 106. A data line 132, which has the first conductive material layer 124 and the second conductive material layer 126 and includes a data pad at one end of the data line 132, is formed in the data region DA.

As discussed above, each of the source electrode 128, the drain electrode 130, the plurality of pixel electrodes 140, the second common electrode 142b, the gate pad terminal 136, the data line 132 and the data pad 134 includes the first conductive material layer 124 and the second conductive material layer 126. The first conductive material layer 124 is formed of a metallic material, such as molybdenum (Mo), titanium (Ti), tantalum (Ta), tungsten (W), copper (Cu) or aluminum neodymium (AlNd). The second conductive material layer 126 is formed of a transparent conductive material, such as indium-tin-oxide (ITO) or indium-zinc-oxide (IZO).

The pixel electrode 140 overlaps the first common electrode 142a to form a storage capacitor Cst. An overlapped portion of the first common electrode 142a functions as a first capacitor electrode 131. An overlapped portion of the pixel electrode 140 functions as a second capacitor electrode 143. The gate insulating layer 110 between the first and second capacitor electrodes 131 and 143 function as a dielectric material. The first capacitor electrode 131, the second capacitor electrode 143 and the gate insulating layer constitute the storage capacitor Cst. The ohmic contact layer 122 is etched using the source and drain electrodes 128 and 130 as an etching mask to expose the active layer 120.

FIGS. 9G, 10G, 11G and 12G show a fourth mask process. As shown in FIGS. 9G, 10G, 11G and 12G, a passivation layer 150 is formed on the source electrode 128, the drain electrode 130, the plurality of pixel electrodes 140, the second common electrode 142b, the gate pad terminal 136, the data line 132 and the data pad 134 by coating an organic insulating material, such as benzocyclobutene (BCB) or acrylic resin. Alternatively, the passivation layer 150 may be an inorganic insulating material, such as silicon nitride (SiNx) or silicon oxide (SiOx). The passivation layer 150 is patterned through a fourth mask process to expose the gate pad terminal 136 and the data pad 134. Although the passivation layer is formed in the pixel region P, the passivation layer in the pixel region P may be removed. The pixel electrodes 140 and the second common electrode 142b may be partially etched to decrease a step difference between the pixel electrodes 140 and the second common electrode 142b and minimize light leakage. Through the above four mask processes, the array substrate for the IPS mode LCD device is fabricated.

Figure 13:
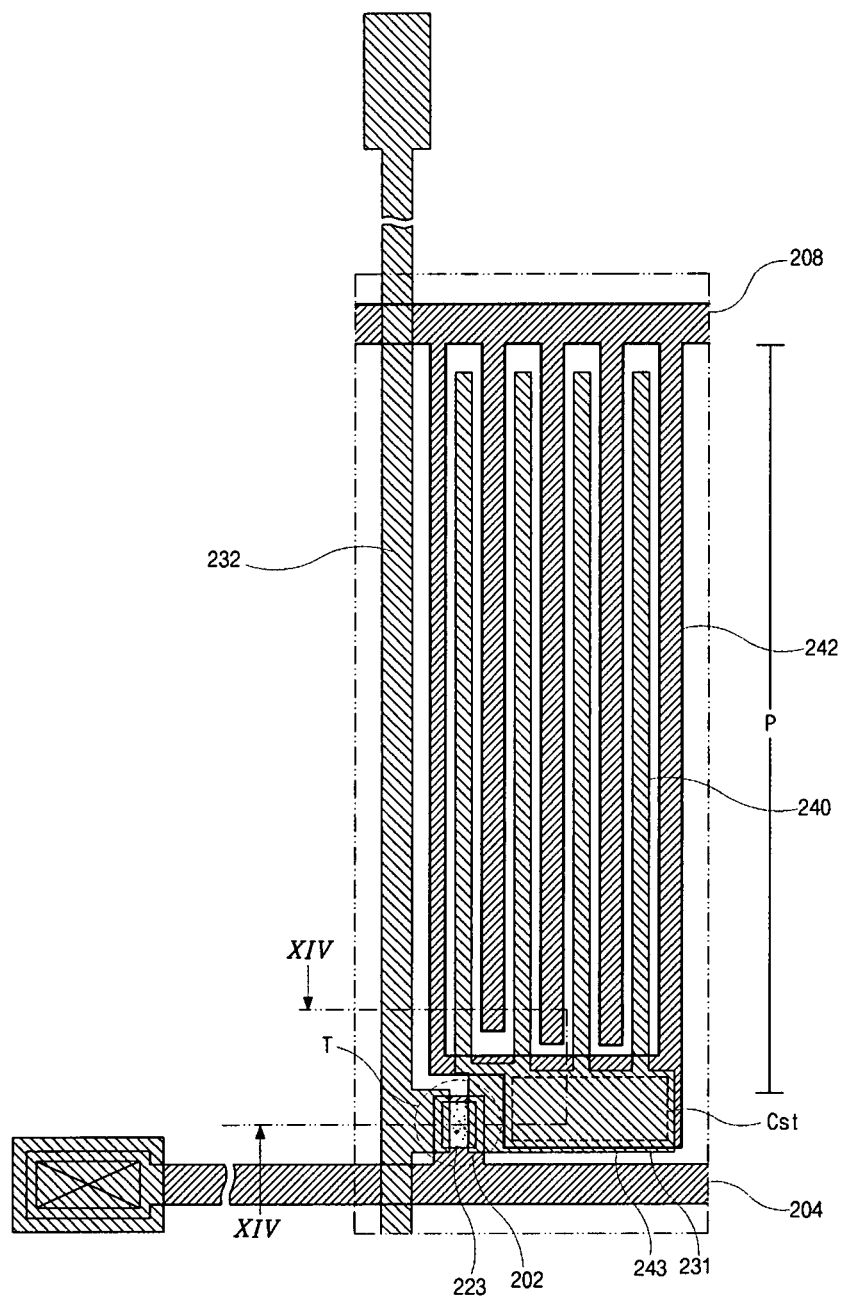
FIG. 13 is a schematic plan view of an array substrate for an IPS mode LCD device according to another embodiment.
Figure 14:
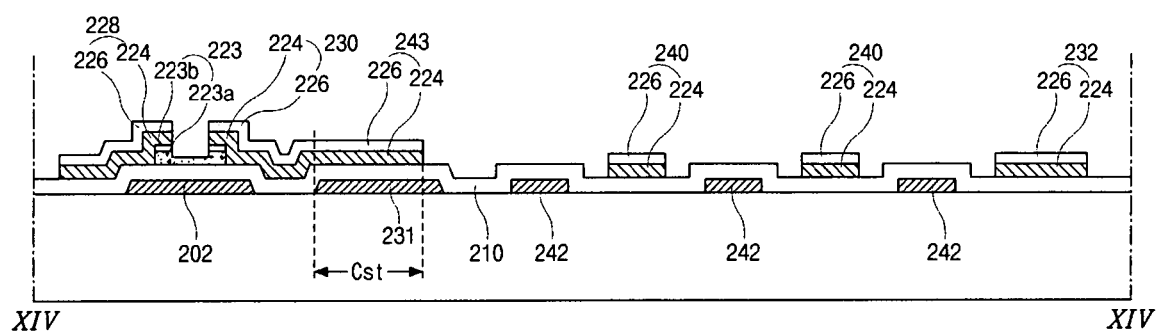
FIG. 14 is a schematic cross-sectional view taken along a line "XIV-XIV" of FIG. 13 according to an embodiment.

FIG. 13 is a schematic plan view of an array substrate for an IPS mode LCD device according to another embodiment. FIG. 14 is a cross-sectional view taken along a line XIV-XIV of FIG. 13 according to one embodiment. Those structures and components that were discussed above will not be described below. In particular, those structures and components that are different from FIG. 7 will be described below.

As shown in FIGS. 13 and 14, a plurality of common electrodes 242 extend from a common line 208, which is parallel to and spaced apart from a gate line 204. The plurality of common electrodes 242 are substantially parallel to and alternately arranged with a plurality of pixel electrodes 240. A first capacitor electrode 231 extends from the common electrodes 242 and overlaps the pixel electrode 240. An overlapped portion of the pixel electrode 240 functions as a second capacitor electrode 243, and a gate insulating layer 210 functions as a dielectric material. The first capacitor electrode 231, the second capacitor electrode 243 and the gate insulating layer constitute a storage capacitor Cst.

The plurality of common electrodes 242 are formed of the same layer and the same material as the gate electrode 202. The plurality of common electrodes 242 are parallel to each other, and the gate insulating layer 210 is disposed on the plurality of common electrodes 242. The plurality of pixel electrodes 240 are disposed on the gate insulating layer 210 and alternately arranged with the plurality of common electrodes 242. The plurality of pixel electrodes 240 has a double-layered structure of a first conductive material layer 224 and a second conductive material layer 226. The common line 208 and the plurality of common electrodes 242 may be one body.

In the array substrate shown in FIGS. 13 and 14, a semiconductor layer 223 has an area less than the gate electrode 202. The semiconductor layer 223 is not formed under the data line 232. A source electrode 228 and a drain electrode 230 have a double-layered structure of the first conductive material layer 224 and the second conductive material layer 226. The second capacitor electrode 243 extends from the drain electrode 230. Since an active layer of intrinsic amorphous silicon has an area less than the gate electrode 202 and is not disposed under the data line 232, there is less degradation of image quality, such as wavy noise. Likewise, in the array substrate for the IPS mode LCD device, since the semiconductor layer 223 has an area less than the gate electrode 202, an active layer 223a of amorphous silicon of the semiconductor layer 223 is not exposed to light. Accordingly, there is no off current in the TFT. In addition, since the semiconductor layer 223 is not formed under the data line 232, an image defect such as a wavy noise is not generated.

Since a single layer of the gate electrode 202 functions as a dielectric material in the storage capacitor Cst, the storage capacitor has sufficient storage capacitance and aperture ratio is improved. In addition, since the pixel electrode 240 is integrated with the drain electrode 230, a portion of a black matrix covering the contact hole may be unnecessary. As a result, aperture ratio is improved.

It will be apparent to those skilled in the art that various modifications and variations can be made in the LCD device of the present invention without departing from the spirit or scope of the invention. Thus, it is intended that the present invention cover the modifications and variations of this invention provided they come within the scope of the appended claims and their equivalents.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive. The above disclosed subject matter is to be considered illustrative, and not restrictive, and the appended claims are intended to cover all such modifications, enhancements, and other embodiments, which fall within the true spirit and scope of the present invention.

What is claimed is:

1. An array substrate for an in-plane switching mode liquid crystal display device, comprising:
   a gate line on a substrate;
   a gate insulating layer on the gate line;
   a data line crossing the gate line to define a pixel region on the substrate;
   a common line substantially parallel to and spaced apart from the gate line;
   a gate electrode connected to the gate line, wherein the gate electrode protrudes from the gate line;
   a semiconductor layer disposed over the gate electrode, wherein an area of the semiconductor layer is less than an area of the gate electrode;
   a source electrode connected to the data line, and a drain electrode spaced apart from the source electrode, the source and drain electrodes disposed on the semiconductor layer;
   a plurality of pixel electrodes integrated with the drain electrode and extending from the drain electrode in the pixel region; and
   a plurality of common electrodes connected to the common line and alternately arranged with the plurality of pixel electrodes,
   wherein each of the source electrode, the drain electrode, the data line and the plurality of pixel electrodes are comprised from a first conductive material layer and a second conductive material layer,
   wherein the second conductive material layer is disposed on the first conductive material layer,
   wherein the plurality of common electrodes includes a first common electrode directly extending from the common line and a second common electrode and which is directly on the gate insulating layer, directly contacts the gate insulating layer, and contacts the common line only through a contact hole of the gate insulating layer,
   wherein the first common electrode has a straight line shape,
   wherein the first common electrode is spaced apart from the data line and does not overlap the data line and the plurality of pixel electrodes,
   wherein the data line directly contacts the gate insulating layer therebelow, and
   wherein the first conductive material layer is made of an opaque metallic material, and the second conductive material layer is made of a transparent conductive material.

2. The array substrate according to claim 1, wherein the second common electrode is comprised from the first and second conductive material layers.

3. The array substrate according to claim 1, wherein a portion of the first common electrode functions as a first capacitor electrode, further wherein a second capacitor electrode extends from the drain electrode and overlaps with the first capacitor electrode.

4. The array substrate according to claim 3, further comprising a gate insulating layer between the first capacitor electrode and the second capacitor electrode, wherein the first capacitor electrode, the second capacitor electrode and the gate insulating layer function as a storage capacitor.

5. The array substrate according to claim 1, further comprising:
   a gate pad disposed at one end of the gate line; and
   a data pad disposed at one end of the data line.

6. The array substrate according to claim 5, further comprising a gate pad terminal on the gate pad, the gate pad terminal comprised from the first and second conductive material layers.

7. The array substrate according to claim 6, further comprising a passivation layer on the gate pad terminal and the data pad, the passivation layer including an opening exposing the gate pad terminal and including an opening exposing the data pad.

8. The array substrate according to claim 7, wherein the plurality of common electrodes are formed of the same material and on the same layer as the gate electrode.

9. The array substrate according to claim 8, wherein a gate insulating layer between the first capacitor electrode and the second capacitor electrode, wherein the first capacitor electrode, the second capacitor electrode and the gate insulating layer function as a storage capacitor.

10. The array substrate according to claim 1, wherein the first conductive material layer includes at least one of molybdenum (Mo), titanium (Ti), tantalum (Ta), tungsten (W), copper (Cu) and aluminum neodymium (AlNd).

11. The array substrate according to claim 1, wherein the second conductive material layer includes one of indium-tin-oxide (ITO) and indium-zinc-oxide (IZO).

12. The array substrate according to claim 1, wherein the semiconductor layer includes an active layer of an intrinsic amorphous silicon and an ohmic contact layer of an impurity-doped amorphous silicon on the active layer.

13. The array substrate according to claim 1, wherein the first common electrode is disposed at boundary portions of the pixel region and the second common electrode is disposed at a central portion of the pixel region.

* * * * *